United States Patent [19]
Kobayashi et al.

[11] Patent Number: 5,477,187
[45] Date of Patent: Dec. 19, 1995

[54] FEED FORWARD AMPLIFIER

[75] Inventors: Fumihiko Kobayashi; Isamu Umino; Yoshiyasu Tsuruoka; Junichi Hasegawa; Toshiaki Suzuki; Tomohiro Nakamura; Teruhiko Kitazawa; Mitsunori Hanaka, all of Kawasaki, Japan

[73] Assignee: Fujitsu Limited, Kawasaki, Japan

[21] Appl. No.: 150,087

[22] PCT Filed: Mar. 17, 1993

[86] PCT No.: PCT/JP93/00313

§ 371 Date: Apr. 22, 1994

§ 102(e) Date: Apr. 22, 1994

[87] PCT Pub. No.: WO93/19521

PCT Pub. Date: Sep. 30, 1993

[30] Foreign Application Priority Data

Mar. 19, 1992 [JP] Japan ................................. 4-063823
Jul. 16, 1992 [JP] Japan ................................. 4-189317

[51] Int. Cl.⁶ ........................................................ H03F 1/26
[52] U.S. Cl. ................................................ 330/52; 330/151
[58] Field of Search ................................ 330/52, 149, 151

[56] References Cited

U.S. PATENT DOCUMENTS 4,389,618 6/1983 Bauman .............................. 330/151 X
5,157,345 10/1992 Kenington et al. ...................... 330/149

FOREIGN PATENT DOCUMENTS 57-181121 11/1982 Japan .
61-164307 7/1986 Japan .
198809 8/1989 Japan ..................................... 330/151
4-083406 3/1992 Japan .
4-070203 3/1992 Japan .
4-233809 8/1992 Japan .
4-364602 12/1992 Japan .
2107540 4/1983 United Kingdom ................... 330/151

OTHER PUBLICATIONS

Seidel, "A Microwave Feed–Forward Experiment", *The Bell System Technical Journal*, Nov. 1971, pp. 2879–2916.

Primary Examiner—James B. Mullins
Attorney, Agent, or Firm—Staas & Halsey

[57] ABSTRACT

In a feed forward amplifier, an RF amplifier is supplied with an input RF signal at an input terminal for amplifying the same; a distortion extraction loop supplied with the input RF signal and further with the output RF signal from the RF amplifier is for extracting non-linear distortion components formed in the output RF signal as a result of amplification in the RF amplifier; a variable phase shifter is provided in the distortion extraction loop for varying a phase of the input RF signal; a variable attenuator is provided in the distortion extraction loop for attenuating an amplitude of the input RF signal that has been supplied to the distortion extraction loop; and a distortion extraction circuit is provided in the distortion extraction loop for producing a distortion output signal that includes non-linear components; further, a control circuit is supplied with the input signal and with the distortion output signal for extracting a main signal component contained in the distortion output signal. The control circuit controls the variable phase shifter and the variable attenuator such that a ratio of the main signal component level with respect to the input RF signal level is decreased.

12 Claims, 25 Drawing Sheets

FIG.3(A)
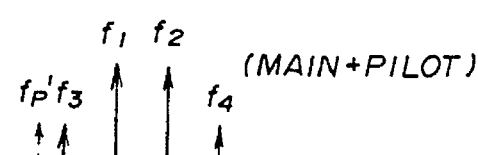
FIG.3(B)
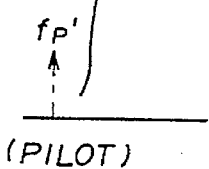
FIG.3(C)
FIG.3(D)
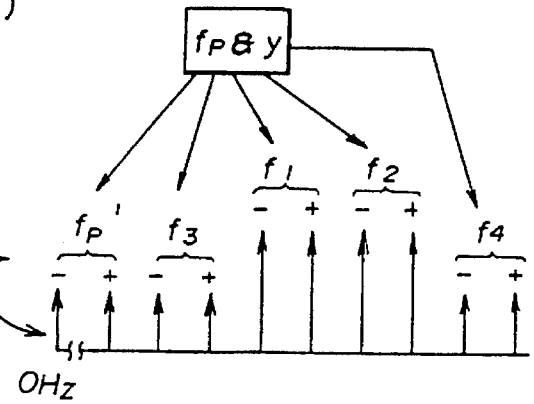
FIG.3(E)
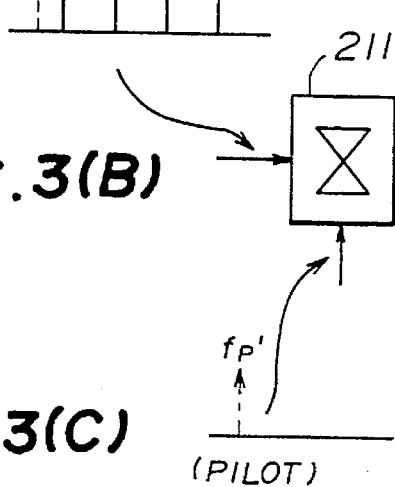
FIG.3(F)
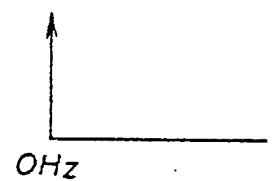
FIG.3(G)
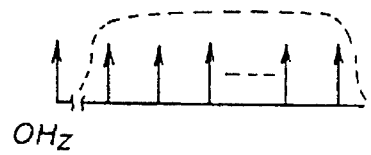
FIG.3(H)

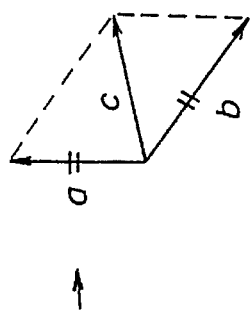
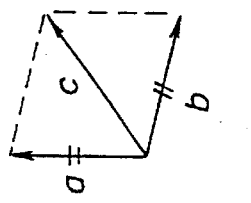
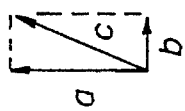
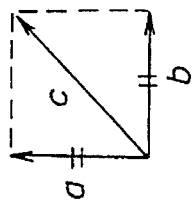
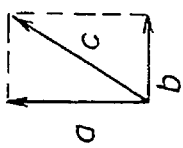
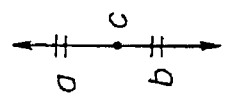
FIG.5(A)  FIG.5(B)  FIG.5(C)

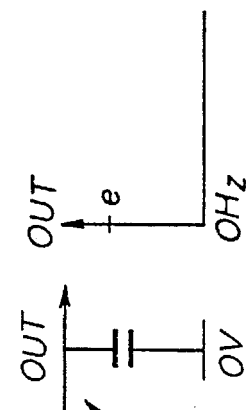
FIG.14(A)
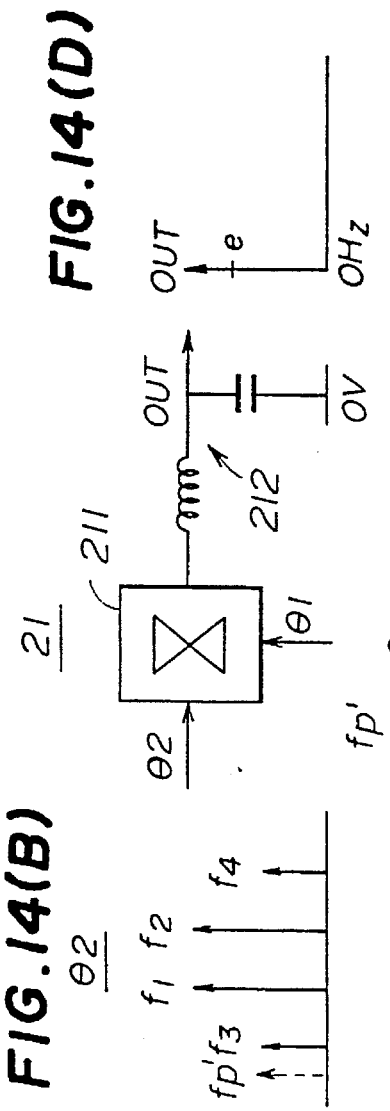
FIG.14(B)
FIG.14(C)
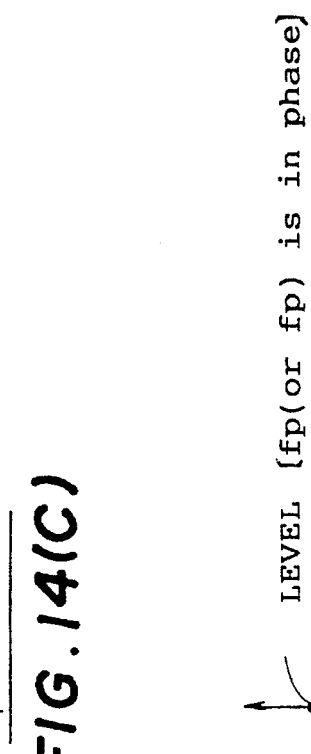
FIG.14(D)
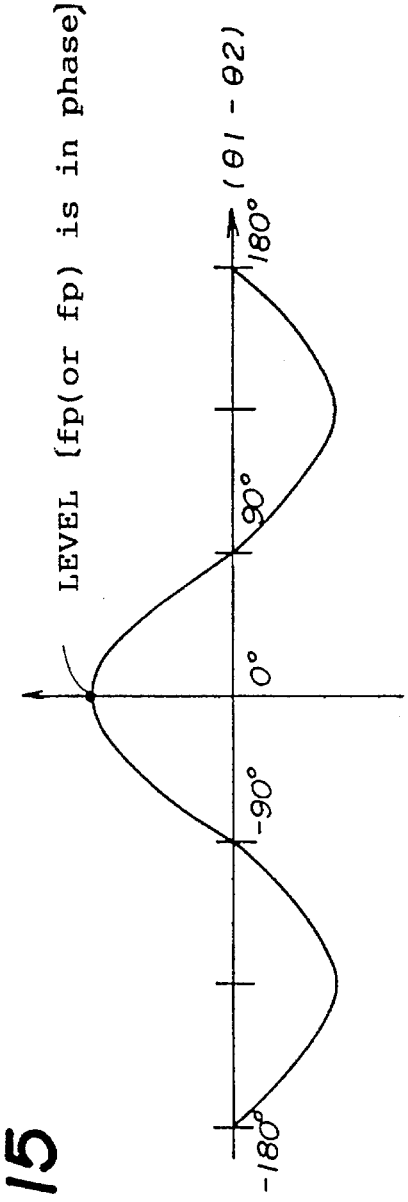
FIG.15

FEED FORWARD AMPLIFIER

TECHNICAL FIELD

The present invention generally relates to radio telecommunication systems and more particularly to a feed forward amplifier suitable for a broadband RF amplifier used in base stations of mobile telephone systems as well as to a control of such a feed forward amplifier.

BACKGROUND ART

With the deployment of digital mobile telephone systems, there is a demand for compact, low-power consumption base stations that can be constructed at a reduced cost. In order to achieve this object, a common amplification construction is employed for the RF amplifiers of the base stations, wherein a plurality of carriers of different frequencies are amplified by a common, single amplifier. In order to amplify a plurality of signals of different frequencies simultaneously, such amplifiers generally employ the feed forward construction which is suitable for eliminating cross modulation distortion.

In the conventional feed forward amplifiers, however, there has been a problem that the equilibrium of the feed forward loop tend to be lost due to a change in the operational environment such as ambient temperature. Such a deviation of the feed forward loop results in a degradation in the compensation of distortions. In order to avoid such a deviation of the feed forward loop, therefore, the conventional feed forward amplifier generally has a control function for detecting the operational state of the loop and for controlling the loop automatically in response to the detected state of the loop.

FIG. 1 shows the fundamental construction of a well known feed forward amplifier. Referring to FIG. 1, it will be noted that the feed forward amplifier is generally formed of a distortion extraction loop 1 and a distortion elimination loop 2.

In the distortion extraction loop 1, an input RF signal including therein a main signal component is supplied to an input terminal 3, wherein the RF signal is branched by a hybrid circuit 4 into a first branch signal and a second branch signal. The first branch signal is amplified in a main amplifier 5 and branched further in a directional coupler 6. One of the signals thus branched in the directional coupler 6 is then supplied to a power synthesizer 8 via an attenuator 7. On the other hand, the signal of the second branch is supplied to a variable attenuator 10 and a variable phase shifter 11 via a delay line 9, and the signal thus passed through the attenuator 10 and the phase shifter 11 is supplied to the power synthesizer 8. Thereby, the variable attenuator 10 and the variable phase shifter 11 are set such that both main signal components, supplied to the power synthesizer 8 along the first and second paths, have an equal amplitude and delay time as well as a mutually opposite phase difference of 180° (inverse phase relationship). As a result, the main signal components are suppressed in the output of the power synthesizer 8, and the output of the power synthesizer 8 contains only the non-linear distortion components that are formed in the main amplifier 5.

In the distortion elimination loop 2, on the other hand, the other output of the directional coupler 6 is supplied to the power synthesizer 13 via a delay line 12. Further, the non-linear distortion components extracted by the power synthesizer 8 are supplied to a secondary amplifier 16 for amplification via a variable attenuator 14 and a variable phase shifter 15. After amplification in the secondary amplifier 16, the signal is supplied to the power synthesizer 13. In this case, too, the variable attenuator 14 and the variable phase shifter 15 are set such that both of the distortion components supplied to the power synthesizer 13 via respective paths have the same amplitude and delay time as well as a mutually opposite phase difference of 180° and thereby the distortion components are suppressed effectively from the output RF signal of the directional coupler 6 and, hence, in the output RF signal of the main amplifier 5. As a result, the distortion of the main signal is minimized.

As described above, the feed forward amplifier functions effectively only when the two suppression loops are set properly. When the characteristics of various elements forming the loop have changed as a result of the environmental change such as the change of ambient temperature, on the other hand, the desired effect of the loop for suppressing distortion reduces substantially.

In order to overcome this problem, a construction shown in FIG. 2 is proposed in the Japanese Laid-open Patent Publication 1-198809. In the conventional art disclosed therein, there is provided another directional coupler 18 on the output line of the main amplifier 5 in correspondence to the distortion extraction loop 1, in addition to the fundamental construction of FIG. 1. Thereby, a pilot signal produced by a pilot signal generator 19 is injected to the output RF signal a that is outputted from the main amplifier 5. Further, a directional coupler 23 is provided on the output line of the secondary amplifier 16 which is included in the distortion elimination loop 2, for branching the output of the amplifier 16. One of the output signals of the secondary amplifier 16 thus branched in the directional coupler 23 is supplied to a power detector 24. Further, there is provided another directional coupler 20 on the output line of the power synthesizer 13, wherein an output signal c of the feed forward amplifier, which has been branched in the directional coupler 20, is supplied to a pilot signal detector 21 together with the pilot signal produced by the pilot oscillator 19. Further, the output signal of the pilot detector 21 and the output of the power detector 24 are supplied to a control circuit 22. The control circuit 22, in turn, supplies control voltage signals to the variable attenuators 10 and 14 and the variable phase shifters 11 and 15 in the distortion extraction loop 1 and in the distortion elimination loop 2.

In the control circuit 22, the variable attenuator 10 and the variable phase shifter 11 are controlled such that the output voltage signal of the power detector 24 is minimized. In response to this, the degree of suppression of the main signal component in the output signal (distortion signal b) of the distortion extraction loop 1 is maximized. In the foregoing control operation, the total power of the main signal a and the distortion signal b is detected, and the variable phase attenuator 10 and the variable phase shifter 11 are controlled such that the detected power is minimized. As a result, the suppression of the main signal component in the output distortion signal outputted from the distortion extraction loop is maximized.

FIGS. 3(A)–3(H) show the operation of the pilot detector 21. The pilot detector 21 is formed of a mixer 211 shown in FIG. 3(B) and a low pass filter 212 shown in FIG. 3(F), wherein the mixer 211 is supplied with main signal components $f_1$ and $f_2$ and distortion signal components $f_3$ and $f_4$ shown in FIG. 3(A) and further with a pilot signal $f_o'$ shown in FIG. 3(C). Thereby, ten sets of frequency component signals shown in FIG. 3(D) are obtained in the output of the mixer 211. As the signal component $f_p'$ and the signal component $f_p$ have the same frequency, the sum of the signal components $f_p$ and $f_p'$ produced by the mixer 211 has a frequency of $2f_p'$ ($2f_p$). Further, the mixer 211 produces a d.c. component of zero frequency as the difference signal.

Thus, by causing the output signal of the mixer 211 shown in FIG. 3(E) to pass through the low pass filter 212, the frequency components shown in FIG. 3(G) are eliminated, and the d.c. component shown in FIG. 3(H) is obtained as the difference signal having the frequency of $f_p'-f_p$.

Meanwhile, the control circuit 22 controls the variable attenuator 14 and the variable phase shifter 15 such that the d.c. output voltage of the pilot detector 21 shown in FIG. 3(H) becomes minimum. In other words, the control circuit 22 controls the variable attenuator 14 and the variable phase shifter 15 such that the pilot signal component in the output RF signal a and the pilot signal component in the distortion output signal b have a mutually identical level and mutually opposite phases. As a result of such a control, the elimination of distortion components in the distortion elimination loop 2 is maximized. As the pilot signal injected to the output of the main amplifier 5 passes through the same signal path as the distortion components formed in the main amplifier 5, the suppression of the pilot signal is equivalent to the suppression of the distortion components. FIGS. 4(A)–4(C) show the waveform of the signals a–c in the distortion elimination loop 2.

In such a conventional feed forward amplifiers, on the other hand, there has been a problem in that a long time is needed for reaching a convergence of operation of the feed forward loop because of the fact that the variable attenuator 10 and the variable phase shifter 11 in the distortion elimination loop 1 are controlled in response to the output of the pilot detector 21 while the variable attenuator 14 and the variable phase shifter 15 are controlled simultaneously. In the worst case, the operation of the feed forward amplifier may not converge at all.

The above problem will be described in more detail with reference to FIGS. 5(A)–5(C), wherein FIG. 5(A) shows the case where both the magnitude and phase of the output signal c change in response to a change in the phase of the distortion signal b. In FIG. 5(A), it should be noted that there is no substantial change in the magnitude of the signal b. FIG. 5(B), on the other hand, shows the case wherein both the magnitude and phase of the output signal c change in response to a change in the magnitude of the distortion signal b alone. In the case of FIG. 5(B), the phase of the signal b does not change substantially.

Thus, in the conventional system, it is extremely difficult to obtain the desired convergence of the system as shown in FIG. 5(C) by merely changing the phase and the magnitude of the distortion signal b at the same time.

In order to overcome the problem, the conventional system has employed a complex time sequential process for controlling the foregoing loop 1 and the loop 2 separately. However, such a time sequential process is complex and takes a long time until the operation of the loop converges. Further, such a system has a drawback in that one cannot determine which one of the loop 1 and the loop 2 contains a defect when the system shows a failure.

Further, in the RF amplifiers for use in the base stations of mobile telephone network, the input level tends to change with time in response to the movement of the mobile terminals. Thereby, there may be a case where one cannot ascertain the cause of the apparent variation of the output voltage signal of the power detector 24. It will be noted that one cannot ascertain whether such a variation has been caused as a result of the problems in the feed forward loop or as result of the variation in the level of the incoming RF signal. When the optimization of the feed forward loop is carried out in such a situation, there can even be a case where the cross distortion in the signal increases as a result of the control.

In the feed forward amplifier of FIG. 2 and with reference to FIG. 6, it should also be noted that the non-linear distortion components in the RF signal B, which signal B being outputted from the amplifier 5, are canceled out by the non-linear distortion components contained in the RF signal E that is produced by the variable phase shifter 15, as indicated schematically in FIG. 6. Thereby, the control of the variable attenuator 10 or 14, as well as the control of the variable phase shifter 1 or 15, are achieved based upon the residual non-linear distortion components remaining in the RF signal F by detecting the residual non-linear distortion components by the directional coupler 20. The non-linear distortion component remaining in the signal F is naturally very small, as a result of the distortion compensation operation conducted by the feed forward loop 1, and because of this, there is a tendency that the control of the distortion extraction loop 1 or the distortion elimination loop becomes unstable. This problem is not resolved completely even when a pilot signal is injected to the output of the amplifier 5 as in the circuit of FIG. 2. In FIG. 6, it should be noted that the signal A represents the spectrum of the RF signal as supplied to the feed forward amplifier, the signal B represents the spectrum of the RF signal outputted from the amplifier 5, the signal C represents the spectrum of the RF signal outputted from the variable phase shifter 11, the signal D represents the spectrum of the RF signal outputted from the power synthesizer 8, the signal E represents the spectrum of the RF signal outputted from the variable phase shifter 15, and the signal F represents the spectrum of the output RF signal detected by the directional coupler 20. While the spectrum A contains only the main signal components, it will be noted that the spectrum B contains the non-linear distortion components in addition to the main signal components. Further, the spectrum C contains the main signal components in the state that the phase thereof is inverted, while the spectrum D represents the non-linear distortion components that have been extracted by canceling out the main signal components in the spectrum C by the main signal components in the spectrum B. Further, the spectrum E represents the signal components wherein the phase of the non-linear distortion components is inverted.

DISCLOSURE OF THE INVENTION

Accordingly, it is a general object of the present invention to provide a novel and useful feed forward amplifier.

Another and more specific object of the present invention is to provide a feed forward amplifier including a distortion extraction loop for extracting non-linear distortion components formed in a main amplifier and a distortion elimination loop for canceling out said distortion components by injecting said non-liner distortion components into an output signal of said main amplifier after modification, wherein said feed forward amplifier controls said two loops independently for reducing the time needed for achieving control, said feed forward amplifier thereby facilitating a detection of failures, and wherein said feed forward amplifier operates with reliability even under existence when of variations in the level of the incoming input signals exist.

Another object of the present invention is to provide a feed forward amplifier comprising:

RF amplification means supplied with an input RF signal at an input terminal for amplifying the same, said RF amplification means thereby producing an output RF signal;

a distortion extraction loop supplied with said input RF signal from said input terminal and further with said output RF signal from said RF amplification means, for extracting non-linear distortion components formed in said output RF signal as a result of amplification in said RF amplification means;

variable phase shifter means provided in said distortion extraction loop for varying a phase of said input RF signal that has been supplied to said distortion extraction loop;

variable attenuation means provided in said distortion extraction loop for attenuating an amplitude of said input RF signal that has been supplied to said distortion extraction loop; and distortion extraction means provided in said distortion extraction loop, said distortion extraction means being supplied on the one hand with said input RF signal after processing in said variable phase shifter means and said variable attenuation means and on the other and with said output RF signal from said RF amplification means, for producing a distortion output signal that includes non-linear components;

wherein said feed forward amplifier further comprises control means supplied with said input signal that has been supplied to said input terminal and further with said distortion output signal for extracting a main signal component contained in said distortion output signal, said control means controlling said variable phase shifter means and said variable attenuation means such that a ratio in level of said main signal component is decreased with respect to said input RF signal.

According to the present invention, one can minimize the level of the main signal component in the distortion output signal relatively to the level of the input RF signal. Associated therewith, the suppression of the main signal component in the foregoing distortion output signal is maximized even when the power level of the incoming RF signal has been changed. Thus, the feed forward amplifier of the present invention is particularly suitable for the broad band RF amplifiers used in the base station of mobile telephone networks wherein the level of the input RF signal changes variously with time. In the feed forward amplifier of the present invention, as the suppression of the main signal component in the distortion output signal is achieved with respect to the level of the input RF signal, the operation of the amplifier converges easily by a simple control system. Further, because of the fact that the optimization of the distortion extraction loop and the optimization of the distortion elimination loop are carried out independently from each other, the optimization process of the distortion extraction loop does not cause interference with the optimization process of the distortion elimination loop, and the control system is quickly stabilized to a converged state. Further, according to the present invention, any abnormal operation of the distortion extraction loop is easily detected by examining whether or not the level of the main signal component in the distortion output signal exceeds a predetermined threshold.

Another object of the present invention is to provide a feed forward amplifier comprising:

RF amplification means supplied with an input RF signal at an input terminal for amplifying the same, said RF amplification means thereby producing an output RF signal;

a distortion extraction loop supplied with said input RF signal from said input terminal and further with said output RF signal from said RF amplification means, for extracting non-linear distortion components formed in said output RF signal as a result of amplification in said RF amplification means;

distortion elimination means supplied with a distortion output signal from said distortion extraction loop and further with said output RF signal from said amplification means, for canceling out said non-liner distortion components contained in said output RF signal by said non-linear distortion components contained in said distortion output signal;

pilot signal generation means for producing a pilot signal; and pilot signal injection means for injecting said pilot signal to said output RF signal produced by said RF amplification means;

wherein said feed forward amplifier further comprises:

pilot signal detection means supplied with said pilot signal from said pilot signal generation means for detecting a pilot signal component contained in a distortion-eliminated output signal that has been produced by said distortion elimination means, said pilot signal detection means conducting a d.c. detection by mixing said pilot signal into said distortion output signal; and control means supplied with a d.c. detection signal from said pilot signal detection means, said d.c. detection signal being obtained in said pilot signal detection means as a result of said d.c. detection, said control means controlling said distortion elimination means such that said d.c. detection signal is minimized.

According to the present invention, the pilot signal component contained in the distortion-eliminated output signal is subjected to the d.c. detection. Thereby, the main signal component contained in the distortion output signal is detected with reliability. Further, the main signal component contained in the foregoing distortion output signal is minimized with reliability. As the pilot signal is injected into the output signal of the foregoing RF amplification means, the signal path of the pilot signal is identical with the signal path of the non-linear distortion components. Thereby, the pilot signal behaves exactly like the non-linear distortion components.

Another object of the present invention is to provide a feed forward amplifier having a distortion extraction loop, wherein the pilot signal, which has been injected to an output RF signal produced by an amplifier in the distortion extraction loop for detection of non-linear distortion, can be detected with a high precision even after the process for eliminating said non-linear distortion has been conducted in a distortion elimination loop.

Another object of the present invention is to provide a feed forward amplifier comprising:

RF amplification means supplied with an input RF signal for producing the same to form an output RF signal;

a distortion extraction loop supplied with said input RF signal and further with said output RF signal from said RF amplifier for extracting non-linear distortion components formed in said output RF signal as a result of amplification in said RF amplifier, said distortion extraction loop thereby producing a distortion output signal that contains therein non-linear distortion components; and a distortion elimination loop supplied with said distortion output signal from said distortion extraction loop and further with said output RF signal from said amplification means for canceling out said non-linear distortion components contained in said output RF signal by non-linear distortion components contained in said distortion output signal;

said distortion elimination loop comprising:

variable attenuation means supplied with said distortion output signal obtained by said distortion extraction means for modifying an amplitude of said distortion output signal;

variable phase shifter means supplied with said distortion output signal obtained by said distortion extraction means for varying a phase of said distortion output signal; and distortion elimination means supplied with said distortion output signal after processing in said variable attenuation means and said variable phase shifter means, said distortion elimination means being further supplied with said output RF signal from said amplification means for synthesizing said distortion output signal and said output RF signal, said distortion elimination means thereby canceling out the non-linear distortion components contained in said output RF signal by the non-linear distortion components contained in said distortion output signal;

wherein said feed forward amplifier further comprises control means supplied with said distortion output signal and further with said output RF signal for controlling said variable attenuation means and said variable phase shifter means, such that said non-linear distortion components in said output RF signal have an amplitude and a phase that are identical to an amplitude and a phase of said non-linear distortion components contained in said distortion output signal.

According to the present invention, the control of the distortion elimination loop is achieved based upon the output RF signal produced by the RF amplification means and further upon the distortion output signal produced by the distortion extraction loop. Thereby, the problem pertinent to the conventional feed forward amplifiers, that the control of the distortion elimination loop is carried out based upon the minute, residual non-linear distortion components that remain after the cancellation of distortion, is effectively avoided, and a reliable optimization of the distortion elimination loop is achieved.

Another object of the present invention is to provide a feed forward amplifier wherein an effective compensation of non-linear distortion is achieved by a simple control process.

Another object of the present invention is to provide a feed forward amplifier comprising:

RF amplification means supplied with input RF signal for amplifying the same to produce an output RF signal;

a distortion extraction loop supplied with said input RF signal and further with said output RF signal of said RF amplification means for extracting non-linear distortion components formed in said output RF signal as a result of amplification by said RF amplifier, said distortion extraction loop thereby producing a distortion output signal that contains said non-liner distortion components; and a distortion elimination loop supplied with said distortion output signal from said distortion extraction loop and further with said output RF signal from said RF amplification means, for canceling out said non-linear distortion components contained in said output RF signal by said non-linear distortion components contained in said distortion output signal;

wherein said distortion extraction loop comprises:

variable phase shifter means supplied with said input RF signal for changing a phase thereof;

phase shifter means supplied with said output RF signal from said RF amplification means for causing a 90° degree phase shift therein;

synchronous detection means supplied with said input RF signal after processing in said variable phase shifter means and further with said output RF signal processed by said phase shifter means for carrying out a synchronous detection, said synchronous detection means thereby detecting main signal components contained in said output RF signal;

control means supplied with said main signal components detected by said synchronous detection means for controlling said variable phase shifter means such that said main signal components are minimized; and distortion extraction means supplied with said input RF signal after processing by said variable phase shifter means and further with said output RF signal produced by said RF amplification means, for causing a cancellation of said main signal contained in said input RF signal and main signal components contained in said output RF signal, said distortion extraction means producing an output signal essentially consisting of said non-linear distortion components, as an output signal.

According to the present invention, the variable phase shifter means is controlled explicitly based upon the main signal components outputted from the synchronous detection means, such that the main signal components in the input RF signal that has been supplied to the foregoing distortion extraction means have a phase shifted by 180° with respect to the phase of the main signal components in the output RF signal. As a result, the extraction of distortion components is achieved by a simple control process. Further, one can eliminate the injection of the pilot signal for extracting the distortions.

Another object of the present invention is to provide a feed forward amplifier wherein the elimination of distortion can be achieved more or less completely.

Another object of the present invention is to provide a feed forward amplifier comprising:

RF amplification means supplied with an input RF signal from an input terminal for amplifying the same to produce an output RF signal;

a plurality of distortion extraction loops each being supplied with said input RF signal from said input terminal and further with said RF signal from said RF amplification means for extracting non-linear distortion components formed in said output RF signal as a result of amplification by said RF amplification means, each of said distortion extraction loops producing a distortion output signal containing therein said non-linear distortion components;

a plurality of distortion extraction loops provided in correspondence to said plurality of distortion extraction loops, said distortion extraction loops being cascaded with each other and supplied with said output RF signal from said RF amplification means, each of said distortion extraction loops being further supplied with a corresponding distortion output signal from a corresponding distortion extraction loop for removing said non-linear distortion components from said output RF signal supplied thereto; and distortion elimination loop control means provided in each of said plurality of distortion elimination loops, each of said distortion elimination loop control means being supplied with said output RF signal from which said non-linear distortion components are eliminated, said distortion elimination loop control means controlling said corresponding distortion elimination loop such that said non-linear distortion components remaining in said output RF signal is minimized.

According to the present invention, the process of elimination of distortion is achieved for a plurality of times, and a complete elimination of distortion is achieved.

BRIEF DESCRIPTION OF THE DRAWINGS

FIGS. 3(A)–3(H) are diagrams showing the operation of the feed forward amplifier of FIG. 2;

FIGS. 5(A)–5(C) are diagrams showing the principle of cancellation of distortion in the feed forward amplifier of FIG. 2;

FIGS. 14(A)–14(D) are diagrams showing the principle of the feed forward amplifier of FIG. 13;

FIG. 15 is another diagram showing the principle of the feed forward amplifier of FIG. 13;

DETAILED DESCRIPTION OF THE INVENTION

Figure 7:
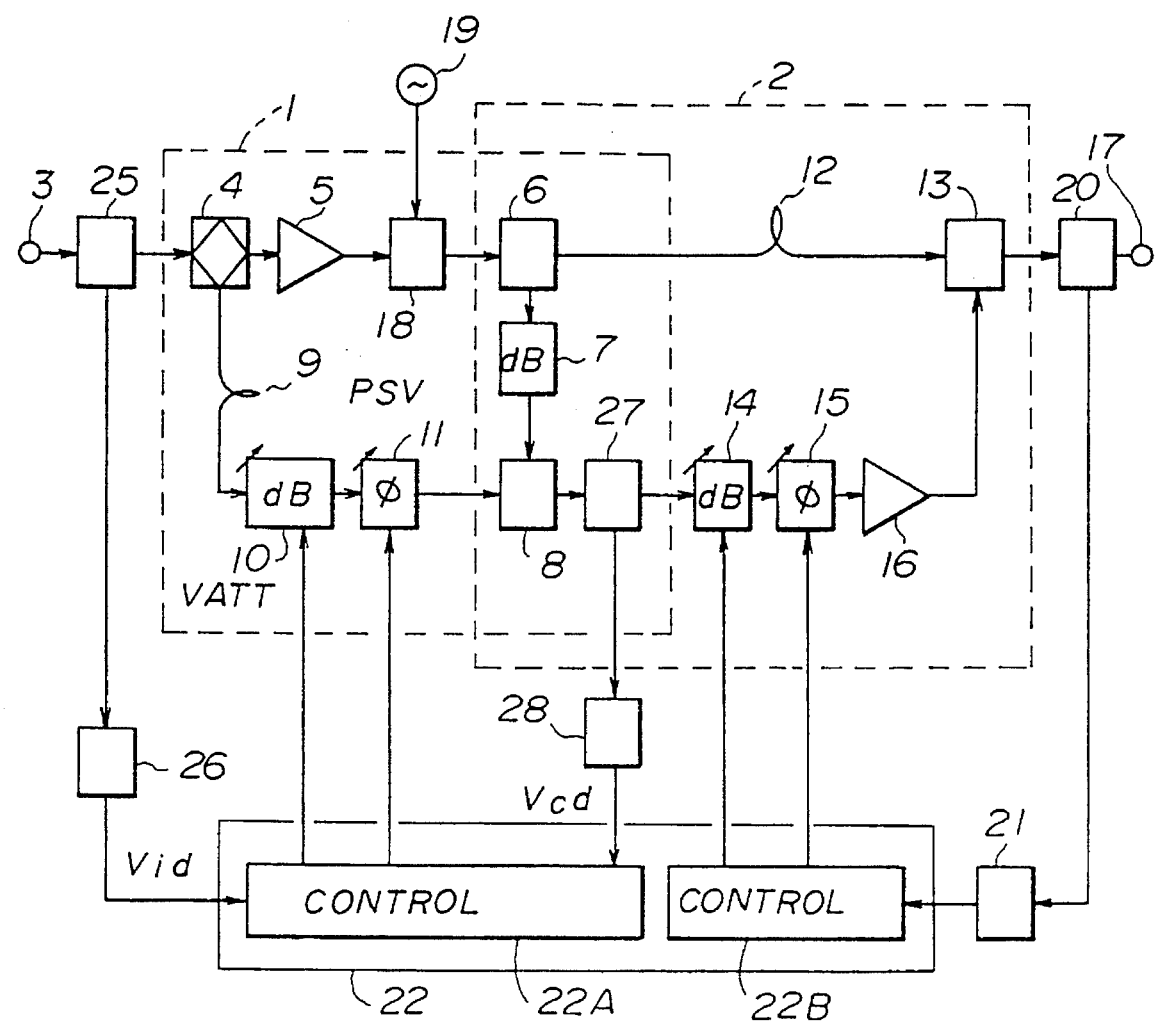
FIG. 7 is a diagram showing the construction of a feed forward amplifier according to a first embodiment of the present invention.

FIG. 7 is a block diagram showing the construction of a feed forward amplifier according to a first embodiment of the present invention. In FIG. 7, those parts corresponding to the parts described previously with reference to FIGS. 1 and 2 are designated by the same reference numerals and the description thereof will be omitted.

In the present embodiment, a directional coupler 25 is provided between the input terminal 3 and the hybrid circuit 4 for branching a part of the input RF signal supplied to the input terminal 3. The RF signal branched at the coupler 25 is then supplied to an input power detector 26, wherein the input power detector 26 detects the power of the input RF signal supplied thereto as the power level of the incoming input RF signal. Further, the input power detector 26 produces an output signal Vid indicative of the power of the input RF signal and supplies the same to a first control unit 22A forming a part of the control circuit 22.

In the circuit of the present embodiment, there is provided a directional coupler 27 on the output path of the power synthesizer 8, wherein the directional coupler 27 branches away a part of the output distortion signal that contains therein the non-linear distortion components and supplies the branched output signal to a main signal detector 28. The main signal detector 28 detects the power of the main signal components that are contained in the distortion output signal supplied thereto and produces an output signal Vcd indicative of the detected power of the main signal components. The output signal Vcd is then supplied to the foregoing first control unit 22A. The control unit 22A in turn controls the variable attenuator 10 and the variable phase shifter 11 based upon the signals Vid and Vcd supplied thereto such that the signal Vcd has a level smaller than the level of the signal Vid by a predetermined factor such as 20 dB or more.

As a consequence of the construction as such, the circuit of FIG. 7 does not use the directional coupler 23 for branching the output signal of the secondary amplifier 16 or the power detector that detects the main signal components from the output of the directional coupler 23. In other words, the construction of FIG. 7 achieves the extraction of the non-linear distortion. components in the distortion extraction loop 1 such that the proportion of the main signal components that are contained in the distortion output signal becomes minimum relative to the main signal components that are contained in the input RF signal supplied to the input terminal 3. Thereby, the extraction of the non-linear distortion is achieved with reliability in the distortion extraction loop 1 even in the case where the transmitted RF power changes with time in response to the movement of mobile terminals as in the case of the base station of mobile telephone network.

Figure 8:
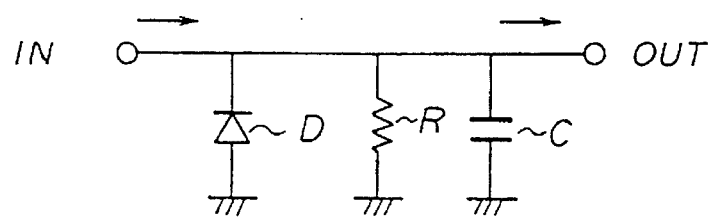
FIG. 8 is a diagram showing the construction of the power detector used in the circuit of FIG. 7.

FIG. 8 shows the construction of power detectors 26 and 28 used in the circuit of FIG. 7. In the illustrated example, the circuit has a usual construction wherein the input RF signal supplied to the input terminal IN is detected by a diode D and smoothed subsequently by a resistor R and a capacitor C. In other words, the power detectors 26 and 28 output a voltage signal indicative of an average power averaged over the entire spectrum of the supplied RF signal.

Figure 2:
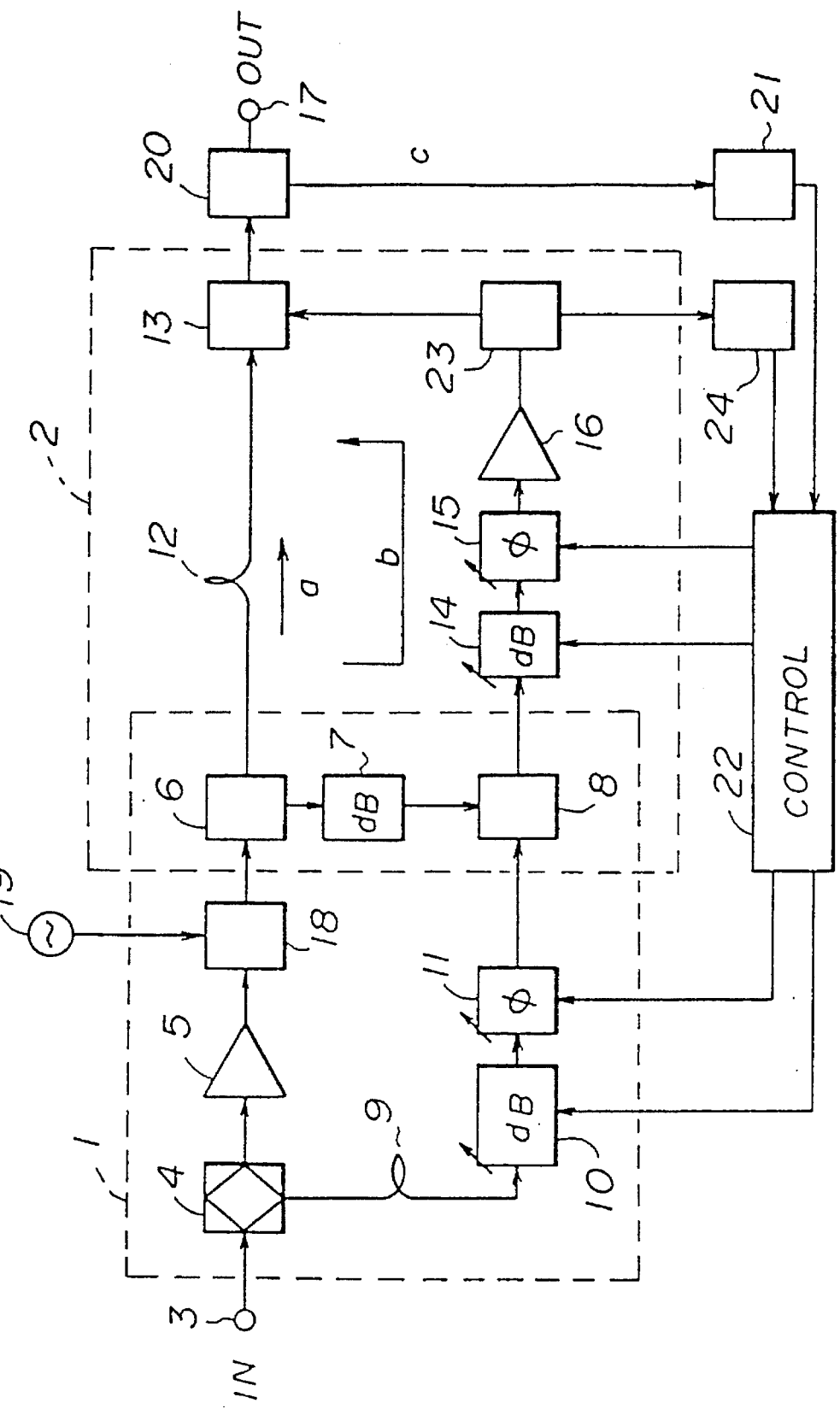
FIG. 2 is a diagram showing the construction of a conventional feed forward amplifier having a control system that operates based upon a pilot signal.

In the embodiment of FIG. 7, it should be noted that the construction and operation of other parts of the circuit are substantially identical with those of FIG. 2. Thus, the pilot signal produced by the pilot signal generator 19 is injected into the output of the main amplifier 5 at the directional coupler 18, wherein the pilot signal thus injected passes through the directional coupler 6 together with the non-linear distortion components formed by the amplifier 5. The pilot signal is thereafter divided into a first path that includes the delay line 12 and a second path that includes the attenuator 7 and the power synthesizer 8. The main signal components are canceled out in the power synthesizer 8 as already explained, and as a result, the non-linear distortion components and the pilot signal are extracted. The non-linear distortion components and the pilot signal thus extracted are supplied to the directional coupler 13 after passing through the variable attenuator 14, the variable phase shifter 15 and the secondary amplifier 16. Thereby, the main signal components are extracted by the directional coupler 13 from the output RF signal by canceling out the non-linear distortion components from the output RF signal by the distortion output signal that has been supplied to the directional coupler 13.

The main signal components thus extracted in the directional coupler 13 are on the one hand supplied to an output terminal 17 via the directional coupler 20, wherein the directional coupler 20 branches a part of the main signal component and supplies the same to the pilot detector 21. The pilot detector 21 in turn detects the pilot signal that is remaining in the output signal of the directional coupler 13 together with the non-linear distortion components, and supplies the detected signal to a second control unit 22B that forms a part of the control circuit. The second control unit 22B in turn controls the variable attenuator 14 and the variable phase shifter 15 in response to the output of the pilot signal detector 13 such that the pilot signal and the non-linear signal component remaining in the output of the directional coupler 13 is minimized.

Next, a second embodiment of the present invention will be described with reference to FIG. 9.

In the present embodiment, another variable attenuator 33 is provided between the directional coupler 25 and the distortion extraction loop 1, in addition to the construction of FIG. 7. Further, an attenuator 30 and a power detector 31 are provided for detecting the output power of the feed forward amplifier, based upon the output signal branched by the directional coupler 20. It should be noted that the power detector 31 detects the level of the output signal of the attenuator 30. Further, there is provided an AGC circuit 32 that controls the variable attenuator 33 in response to the output power detected by the power detector 31 and, further in response to the input power that has been detected by the input power detector 26.

In operation, the AGC amplifier 32 controls the variable attenuator 33 such that the difference between the input power that has been detected by the detector 26 and the output power that has been detected by the detector 31 becomes zero. In this construction, it should be noted that the gain of the feed forward amplifier becomes identical with the attenuation of the attenuator 30, provided that the power detector 26 and the power detector 31 have the same construction. As the output power level of the feed forward amplifier is reduced by a magnitude corresponding to the attenuation of the attenuator 30, the adjustment of the variable attenuator 33 for setting the difference of the power of the input signals to be zero at the AGC amplifier 32 results in a constant difference between the input and output powers of the feed forward amplifier. Since the output power is detected relatively with respect to the input power, the feed forward amplifier maintains a proper operation even when the input power level variably changes.

The foragoing automatic control of the feed forward amplifier is achieved in order to compensate for the temperature variation in various parts of the system. Naturally, the gain of the main amplifier 5 changes with the variation of the temperature. The larger the gain of the main amplifier 5, the larger the effect of the temperature variation. Thus, the feed forward amplifier of the foregoing embodiment can not only compensate for the distortion but also provide a stabilized control of the gain.

Figure 9:
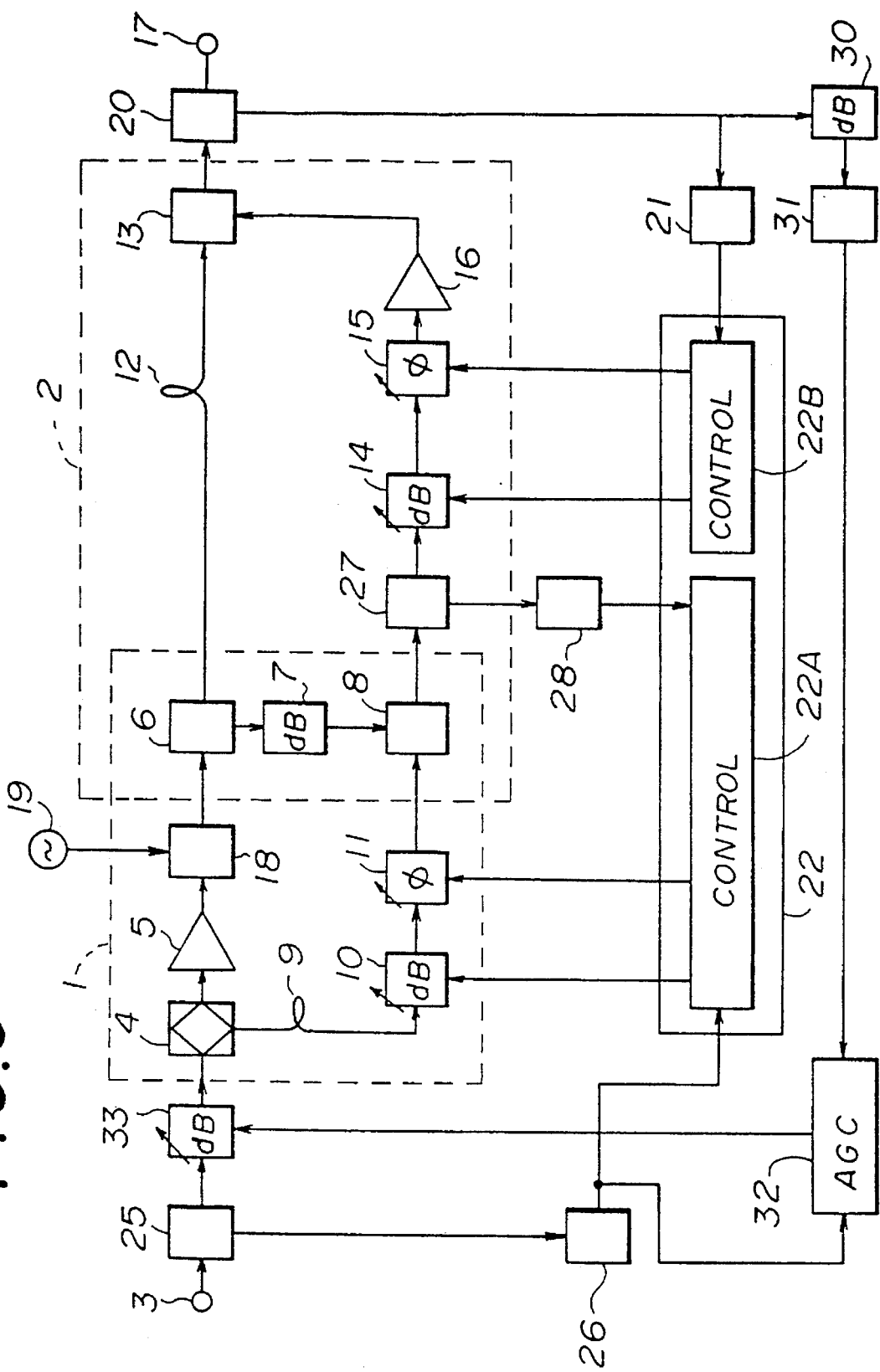
FIG. 9 is a diagram showing the construction of a feed forward amplifier according to a second embodiment of the present invention.
Figure 10:
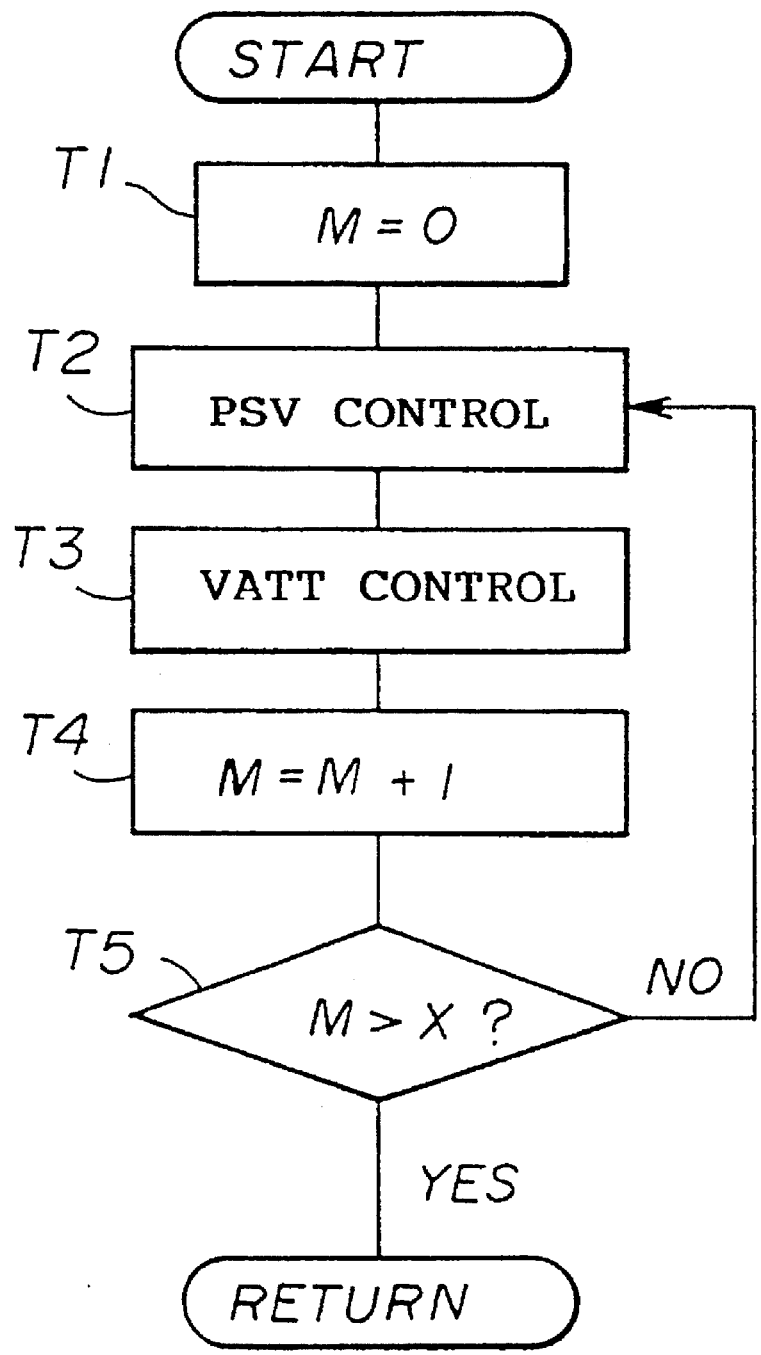
FIG. 10 is a flowchart showing the overall control sequence of the feed forward amplifier of FIGS. 8 and 9.
Figure 11:
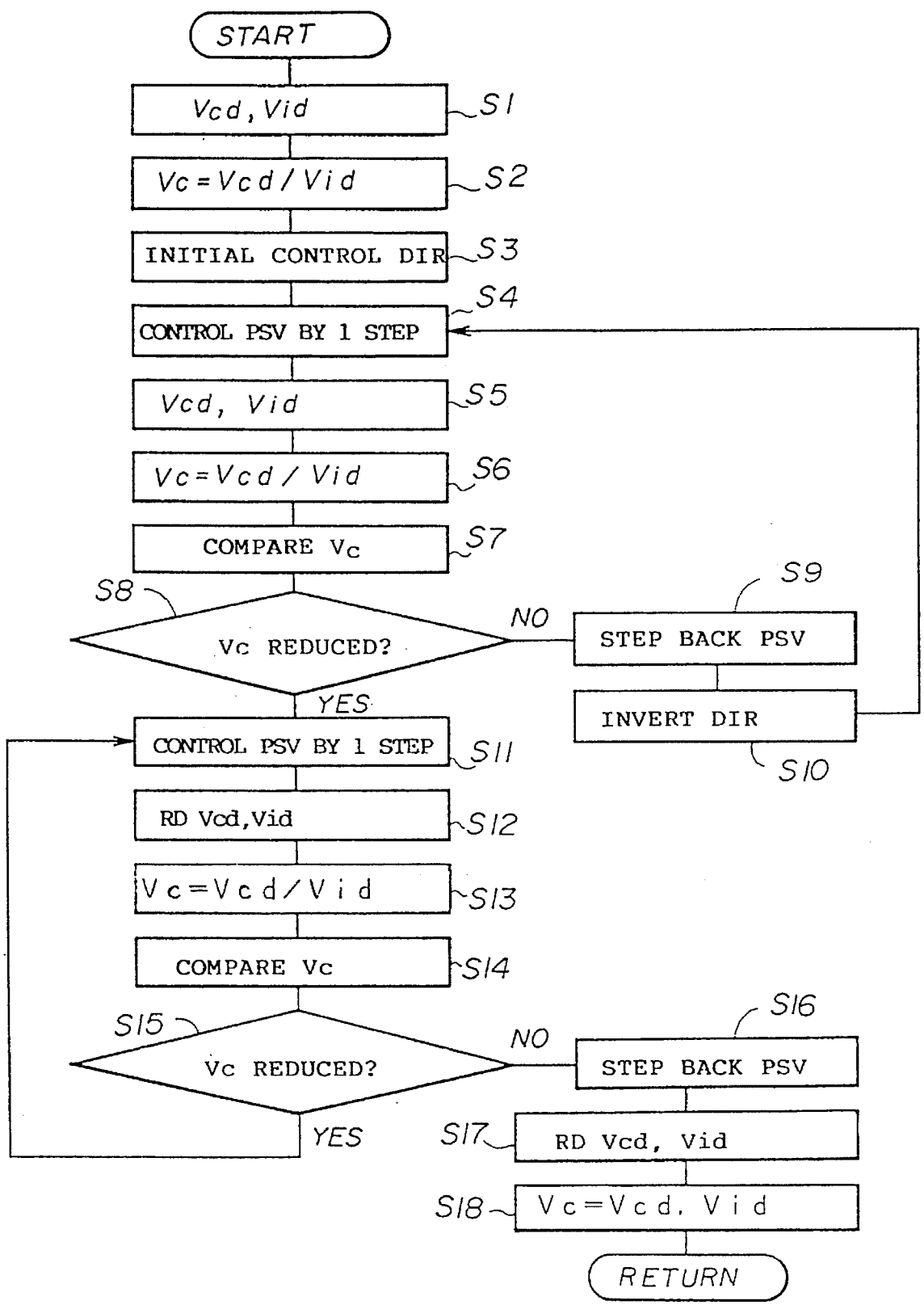
FIG. 11 is a flowchart showing the control sequence of a distortion extraction loop shown in FIG. 10.
Figure 12:
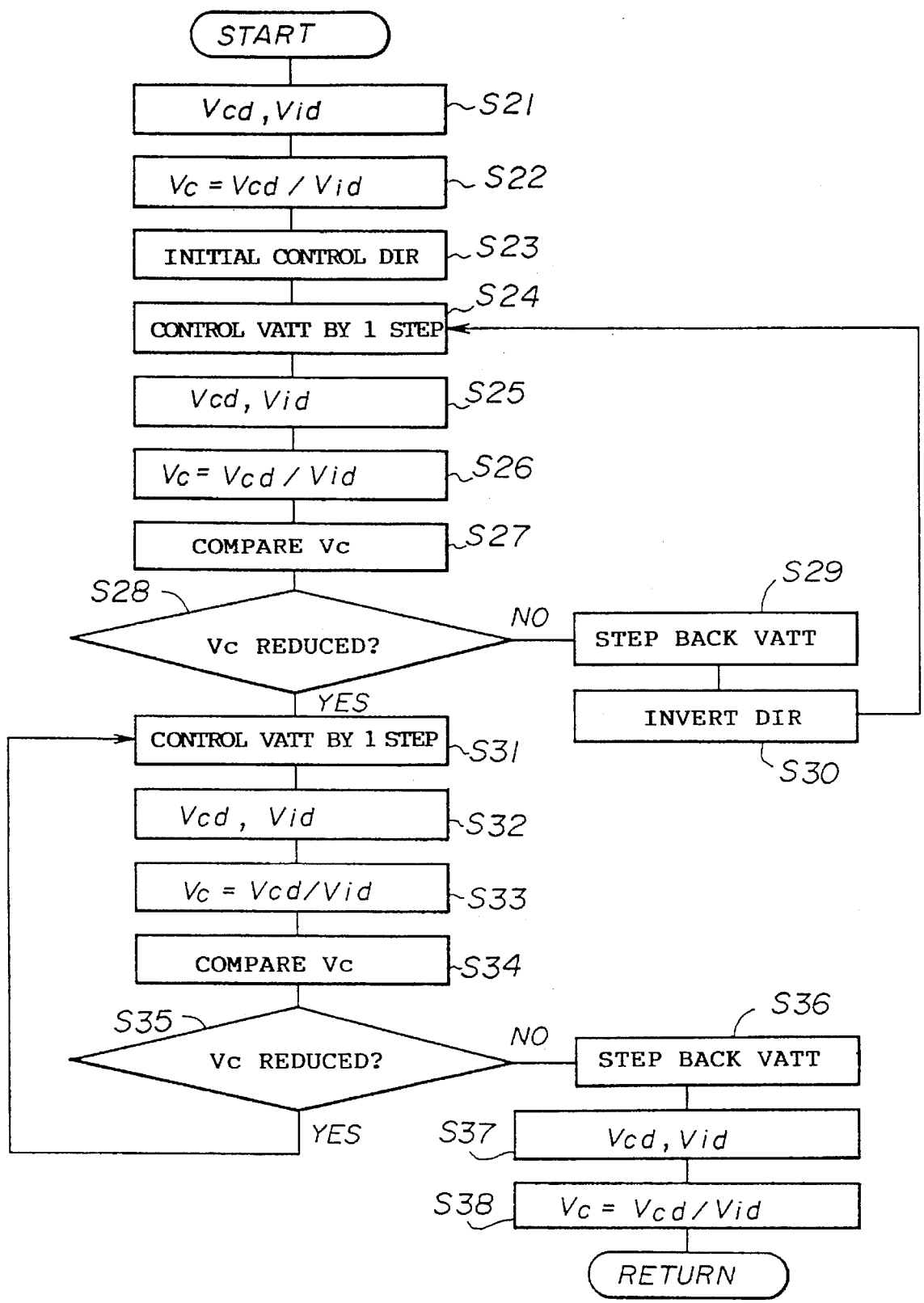
FIG. 12 is a flowchart showing the control sequence of the distortion elimination loop of FIG. 10.

FIGS. 10–12 show the algorithms of the control circuit 22A shown in FIG. 7 and FIG. 9, wherein FIG. 10 shows the flowchart for the overall operation of the control circuit 22, FIG. 11 shows the flowchart for the operation of the variable phase shifter (PSV) 11 shown in the flowchart of FIG. 10 and FIG. 12 shows the flowchart of the operation of the variable attenuator (VATT) 10, shown also in FIG. 10.

Referring to FIG. 10, an index M indicative of the number of iterations is set to "0" (Step T1) and the control of the variable phase shifter (PSV) 11 is carried out subsequently (Step T2). Further, the control of the variable attenuator (VATT) 10 is carried out subsequently (Step T3). After this, the index M is increased by "1" (Step T4), and the steps T2–T5 are repeated (Step T5) until the index M exceeds a predetermined value x.

The step T2 shown in FIG. 10 is carried out in accordance with the flowchart shown in FIG. 11. First, the control circuit 22A reads the output voltage Vid of the input power detector 26 and the output voltage Vcd of the main signal detector 28 (Step S1), and calculates the ratio Vc=Vcd/Vid (Step S2). In this example, it should be noted that the power detectors produce the output signals in the form of voltage signals.

Next, the initial direction for the control of the variable phase shifter 11 is set (step S3), and the variable phase shifter 11 is driven by one step (Step S4). In this state, the output voltages Vid and Vcd are read again (Step S5), and the ratio Vc=Vcd/Vid is calculated again (Step S6). Further, a comparison is made (Step S7) for the parameter Vc with respect to the value of the parameter Vc before the control is made (before the Step S4), and a discrimination is made (Step S8) whether the parameter Vc has decreased as compared to the parameter Vc before the control. If the value of the parameter Vc has not decreased, this indicates that the direction of control is opposite. Thus, the state of the variable phase shifter 11 is stepped back by one (Step S9) and the direction of the control is set opposite (Step S10). Further, the steps S4–S10 are repeated until the value of the ratio Vc becomes smaller than the value of the parameter (ratio) Vc before the control is made.

When it is confirmed in the step S8 that the value of the ratio Vc has decreased before the control has been made, the variable phase shifter 11 is driven by one step further (Step S1) and the output voltages Vid and Vcd are read again (Step S12). Further, the ratio Vc=Vd/Vid is calculated (Step S13) and the value of the ratio Vc thus obtained is compared (Step S14) with the ratio Vc before the control (Step S11). Further, a discrimination is made whether or not the value of the ratio Vc has decreased as compared with the ratio Vc before the control is made (Step S15). When the ratio Vc has decreased, this indicates that there is still room for adjustment and the process returns to the step S11 for repeating the steps S12–S14. On the other hand, when it is confirmed as a result of the step S15 that the value of the ratio Vc does not decrease anymore, the state of the variable phase shifter 11 is stepped back by one (Step S16), and the voltages Vid and Vd are read ("Read") again (Step S17). Further, the ratio Vc=Vcd/Vid is calculated again (Step S18) and the process returns to the flowchart of FIG. 10.

On the other hand, the step T3 shown in FIG. 10 is carried out according to the flowchart of FIG. 12, wherein it will be noted that the process shown in the flowchart of FIG. 12 is substantially identical with the process shown in the flowchart of FIG. 11 except for the fact that the variable attenuator (VATT) 10 is used in place of the variable phase shifter (PSV) 11. For example, the steps S3–S18 of FIG. 11 correspond to the steps S21–S38 of FIG. 12. Thus, description of FIG. 12 will be omitted.

It should be noted that the control sequence of FIGS. 11 and 12 represents a process for seeking the minimum of the ratio Vcd/Vid. On the other hand, one may detect an event that the ratio Vcd/Vid has decreased below a predetermined threshold such as 20 dB and interrupt the control in response to such an event. In such a case, the ratio Vcd/Vid is subjected to a discrimination process whether or not the ratio Vcd/Vid has reduced to the foregoing predetermined value in the step S8 or Step S28, and if the result is NO, the process returns to the step S4 or the step S24. On the other hand, when the result is YES, the process returns to the flowchart of FIG. 10.

In each of the embodiments of FIG. 7 and FIG. 9, it should be noted that the control of the distortion extraction loop 1 and the control of the distortion elimination loop are achieved independently from each other by separate control units, 22A and 22B. As a result, it is possible to optimize the distortion elimination loop 2 after the distortion extraction loop 1 has been optimized. Thereby, the problem of the optimization of the loop 1 and the optimization of the loop 2 cause an interference is successfully avoided. Associated therewith, the problem of a prolonged operational duration needed for achieving the convergence of the system is avoided.

Figure 13:
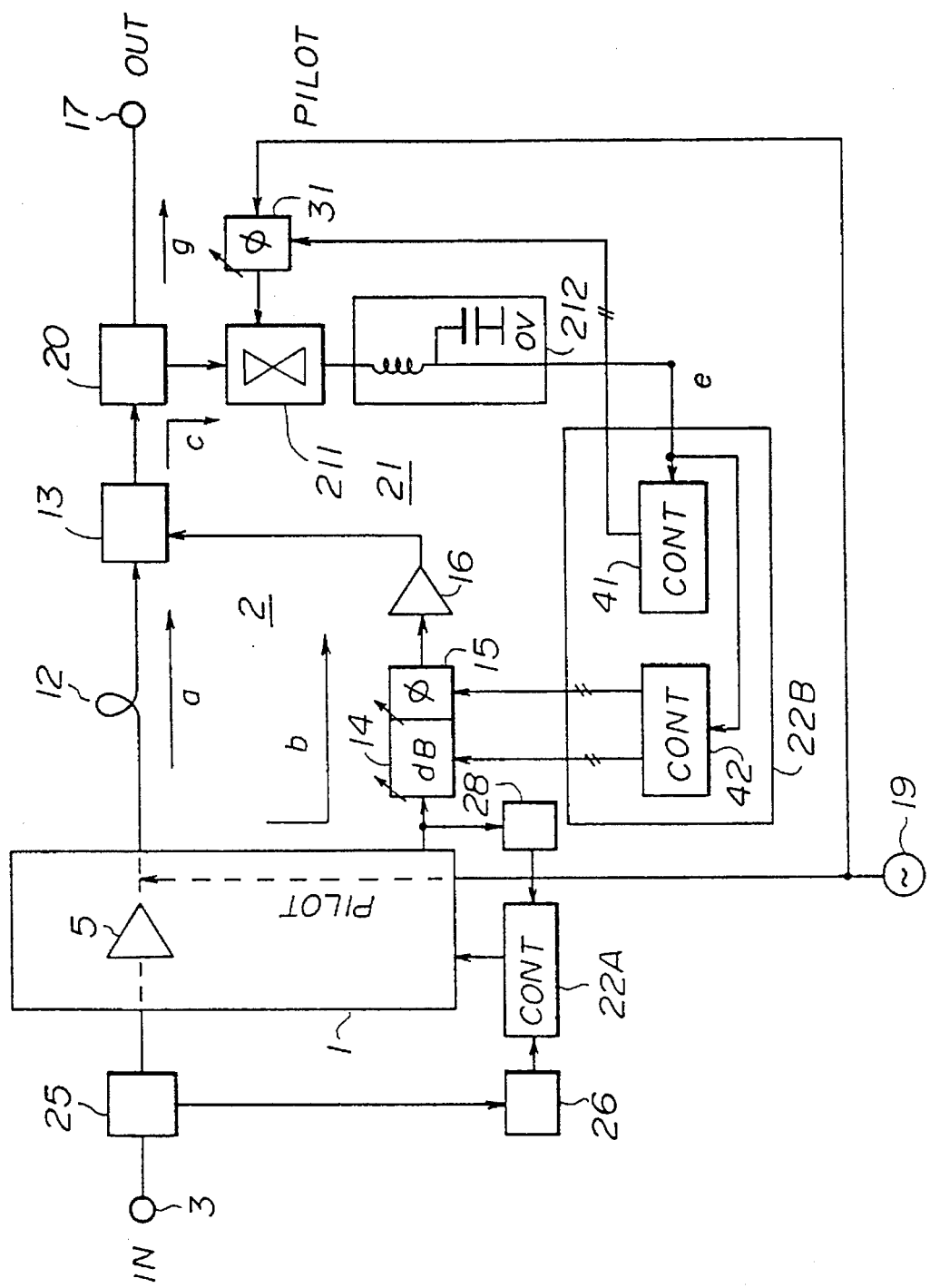
FIG. 13 is a diagram showing the construction of a feed forward amplifier according to a third embodiment of the present invention.

Next, a third embodiment of the present invention will be described with reference to FIG. 13. In FIG. 13, those parts described previously are designated by the same reference numerals.

The present embodiment represents an improvement of the first embodiment shown in FIG. 7 and hence includes a distortion extraction loop 1 and a distortion elimination loop 2 similar to the loops described before. As the construction of the distortion extraction loop 1 is exactly identical with that of the first embodiment, further description will be omitted.

In the present embodiment, a d.c. detector that carries out a d.c. detection is used as the pilot signal detector 21 for detecting the pilot signal from the output RF signal that has been branched by the directional coupler 20. The d.c. detector 21 includes a variable phase shifter 31 that is supplied with the pilot signal from the pilot signal generator 19 for controlling the phase thereof, a mixer 211 for mixing the pilot signal processed by the variable phase shifter 31 and the output RF signal that has been branched by the directional coupler 20, and a low pass filter 212 for filtering the output of the mixer 211, wherein the mixer 211 and the filter 212 produce an output signal e and supplies the same to a control unit 41 and further to a control unit 42, both thereby a part of the control unit 22B. The control unit 41 in turn controls the variable phase shifter 31 based upon the detected pilot signal obtained by the detector 21 such that the phase of the pilot signal supplied to the mixer 211 and the phase of the pilot signal contained in the output RF signal become identical with each other. As a result, the output signal e of the filter 212 represents the d.c. voltage that represents the level of the detected pilot signal.

Further, the foregoing control unit 42 is supplied with the d.c. voltage signal e from the filter 212 and controls the variable attenuator 14 and the variable phase shifter 15 such that the magnitude of the foregoing d.c. voltage signal e is minimized. As a result, the pilot signal as well as the non-liner distortion components remaining in the output RF signal obtained by the directional coupler 13 are minimized, and one obtains an output RF signal from which the non-liner distortion components are eliminated at the output terminal 17.

FIGS. 14(A)–14(D) are the diagrams showing the operational principle of the pilot signal detector 21, wherein FIG. 14(A) shows the construction of the pilot signal detector 21 formed of the mixer 211 and the low pass filter 212. It will be noted that the mixer 211 is supplied with the pilot signal from the variable phase shifter 31 and further with the output RF signal from the directional coupler 20. FIG. 14(B) shows the spectrum of the output RF signal supplied to the mixer 211, wherein it will be noted that the output RF signal contains residual non-linear distortion components $f_3$ and $f_4$ and a residual pilot signal $f_p'$ in addition to the main signal components $f_1$ and $f_2$. FIG. 14(C), on the other hand, shows the spectrum of the pilot signal. As the signal of FIG. 14(C) is the pilot signal itself, the FIG. 14(C) contains only the pilot signal component $f_p'$. FIG. 14(D) on the other hand shows the spectrum of the output signal obtained from the filter 212 in the detector 21. As can be seen in FIG. 14(D), the detector 21 produces the d.c. voltage signal e as a result of the mixing of the output RF signal and the pilot signal followed by the low-pass filtering.

FIG. 15 shows the variation of the output voltage e of the detector 21 that occurs when the phase of the output RF signal and the phase of the pilot signal component in the pilot signal have changed relatively with each other. As can be seen in FIG. 15, the output d.c. voltage e becomes maximum when the phases of the respective pilot signal components in both signals coincides with each other. On the other hand, the output d.c. voltage e becomes zero when the phase difference between the respective plot signals has become 90°.

Figure 16:
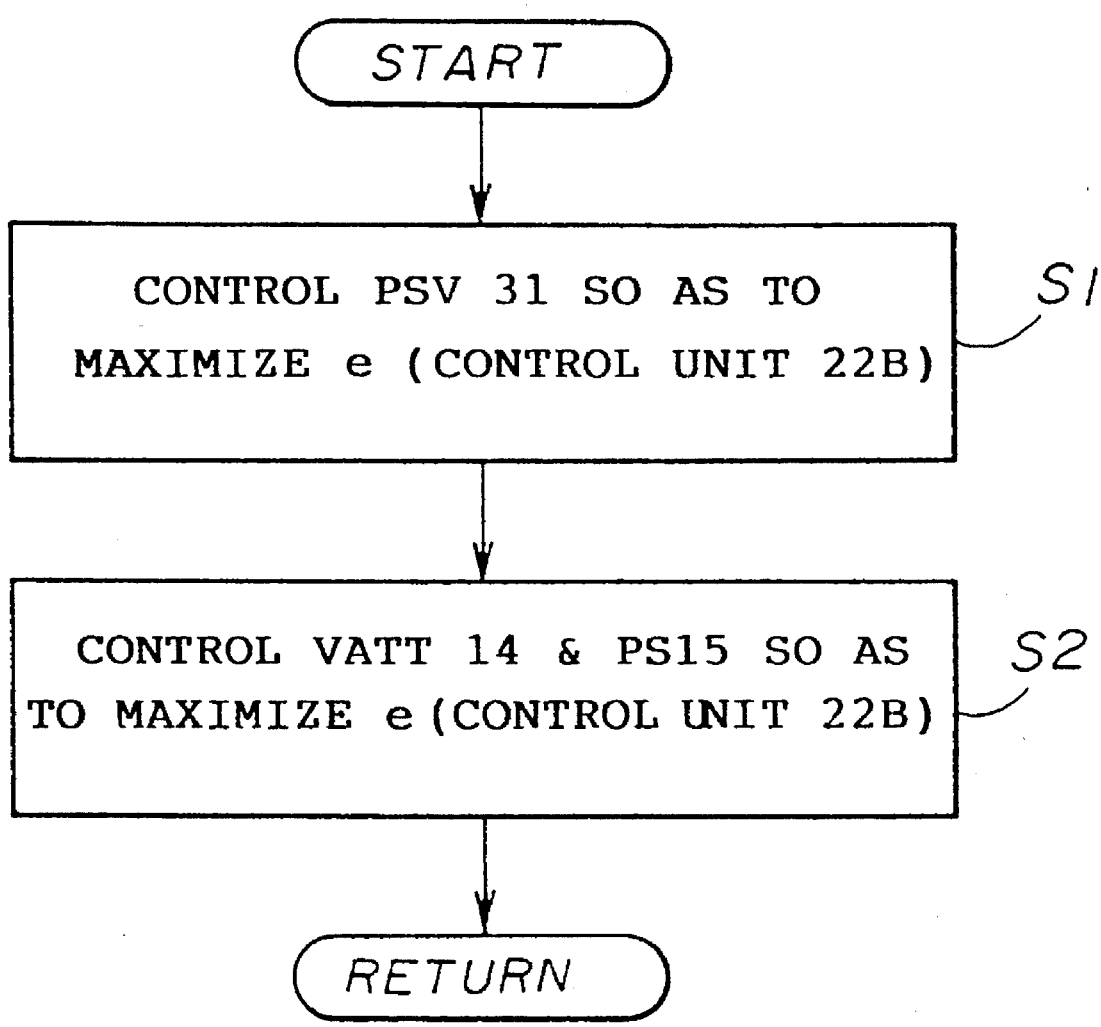
FIG. 16 is a flowchart showing the overall control sequence of the feed forward amplifier of FIG. 13.

In the present embodiment, as shown in the flowchart of FIG. 16, the phase shifter 31 is controlled in a step S1 such that the voltage e becomes maximum. Of course, the control is achieved by the control unit 41 in the control unit 22B as described before. After the voltage e is thus maximized in the step S1, a step S2 is carried out wherein the control unit 42 in the control unit 22B is activated to control the variable attenuator 14 and the variable phase shifter 15 such that the voltage e is minimized. It should be noted that the voltage e represents the level of the pilot signal in the output RF signal and simultaneously the magnitude of the non-linear distortion components contained therein. By minimizing the voltage e, one can minimize the residual non-linear distortion components remaining in the output RF signal. As the control step S1 and the control step S2 can be carried out independently, the optimization in each of the steps does not cause interference to the optimization in the other of the steps, and the optimization of the control system converges quickly.

Figure 17:
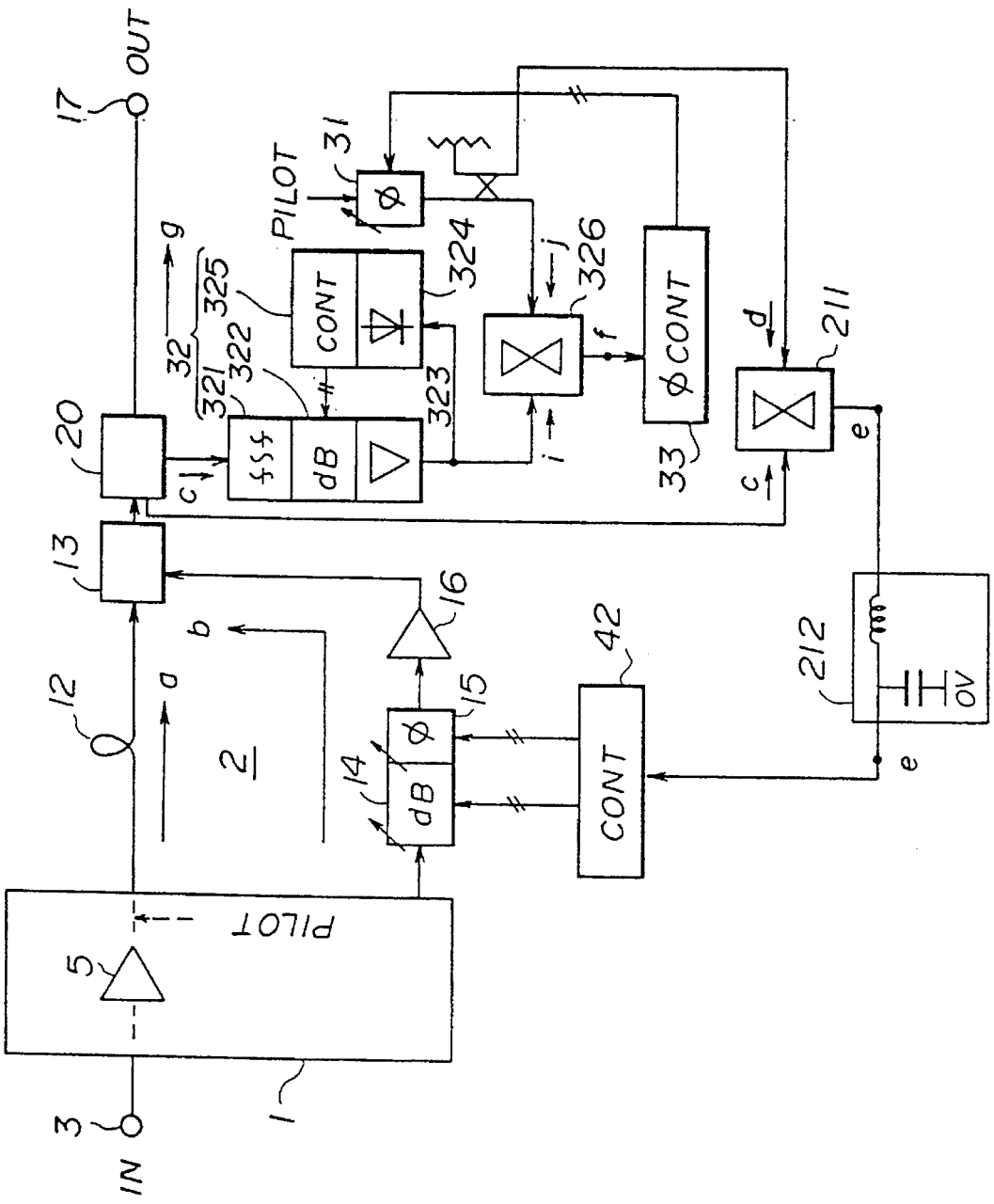
FIG. 17 is a diagram showing the construction of a feed forward amplifier according to a fourth embodiment of the present invention.

FIG. 17 shows a fourth embodiment of the present invention. In FIG. 17, those parts corresponding to the parts of the third embodiment are designated by the same reference numerals and the description thereof will be omitted.

In the present embodiment, whereas the pilot detector 21 is formed of the mixer 211 and the low pass filter 212, similarly to the embodiment of FIG. 7, it will be noted that there is provided another pilot detector 32. This pilot detector 32 includes a band pass filter 321 for extracting the pilot signal component from the signal c that has been branched by the directional coupler 20 and a variable attenuator 322 for adjusting the level of the output signal of the band pass filter 321, as well as an amplifier 323 for amplifying the output signal of the variable attenuator 322. Further, there is provided a detector 324 for detecting the output of the amplifier 323 by conducting a d.c. detection process, a control unit 325 for controlling the variable attenuator 322 in response to the output signal of the detector 324, and a mixer 326 supplied with an output signal i of the amplifier 323 and a part of the output signal j of the variable phase shifter 31 (this may be the output signal d itself of the variable phase shifter 31) for producing a d.c. detection signal f (hereinafter it is assumed that the mixer 326 includes a low pass filter not illustrated). The control unit 42 controls only the variable attenuator 14 and the variable phase shifter 15 in response to the output signal e of the low pass filter 212.

In the present embodiment, the pilot signal remaining unremoved in the signal c, even after the foregoing cancellation process of the distortion components from the main signal a by the distortion signal b, is extracted by the band pass filter 321 and the signal thus extracted is supplied to an AGC circuit that is formed of the variable attenuator 322, the amplifier 323, the detector 324 and the control unit 325. The AGC circuit produces the signal i with a constant predetermined level (corresponding to the level of the original pilot signal of which magnitude is known), and the signal i thus produced is supplied to the mixer 326.

Figure 4A:
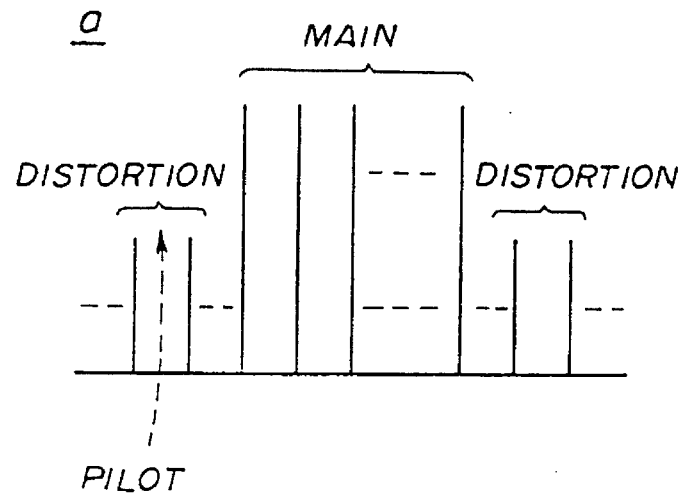
FIGS. 4(A)–4(C) are other diagrams showing the operation of the feed forward amplifier of FIG. 2.
Figure 4B:
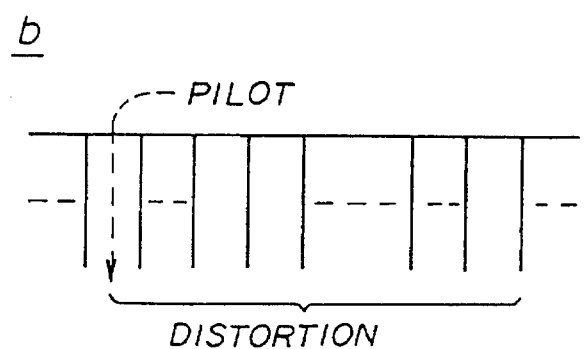
Figure 4C:
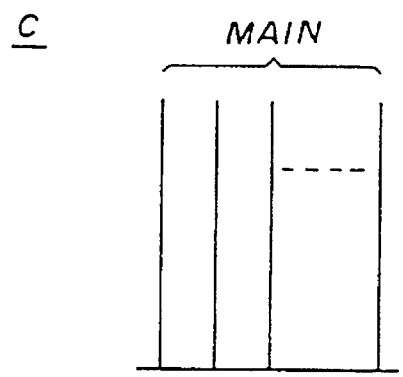

The signal i and the signal j produced by the variable attenuator 31, are supplied to the mixer 326, while the mixer 326 produces a d.c. voltage component as the output signal f. Thereby, a control unit 33 controls the variable phase shifter 31 so as to maximize the signal f, and the signal i and the signal are adjusted to j have the same phase (see FIG. 4(B)).

Thereby, the pilot signals c and d supplied to the mixer 211 are adjusted to have the same phase, and the control circuit 22A controls the variable attenuator 14 and the variable phase shifter 15 such that the voltage e thus obtained by the mixer 211 and the low pass filter 212 is minimized. Ultimately, the distortion signal b is removed from the main signal a and one obtains an output signal g that is free from the distortion. It should be noted that the foregoing signal d represents the pilot signal branched from the signal j.

Figure 18:
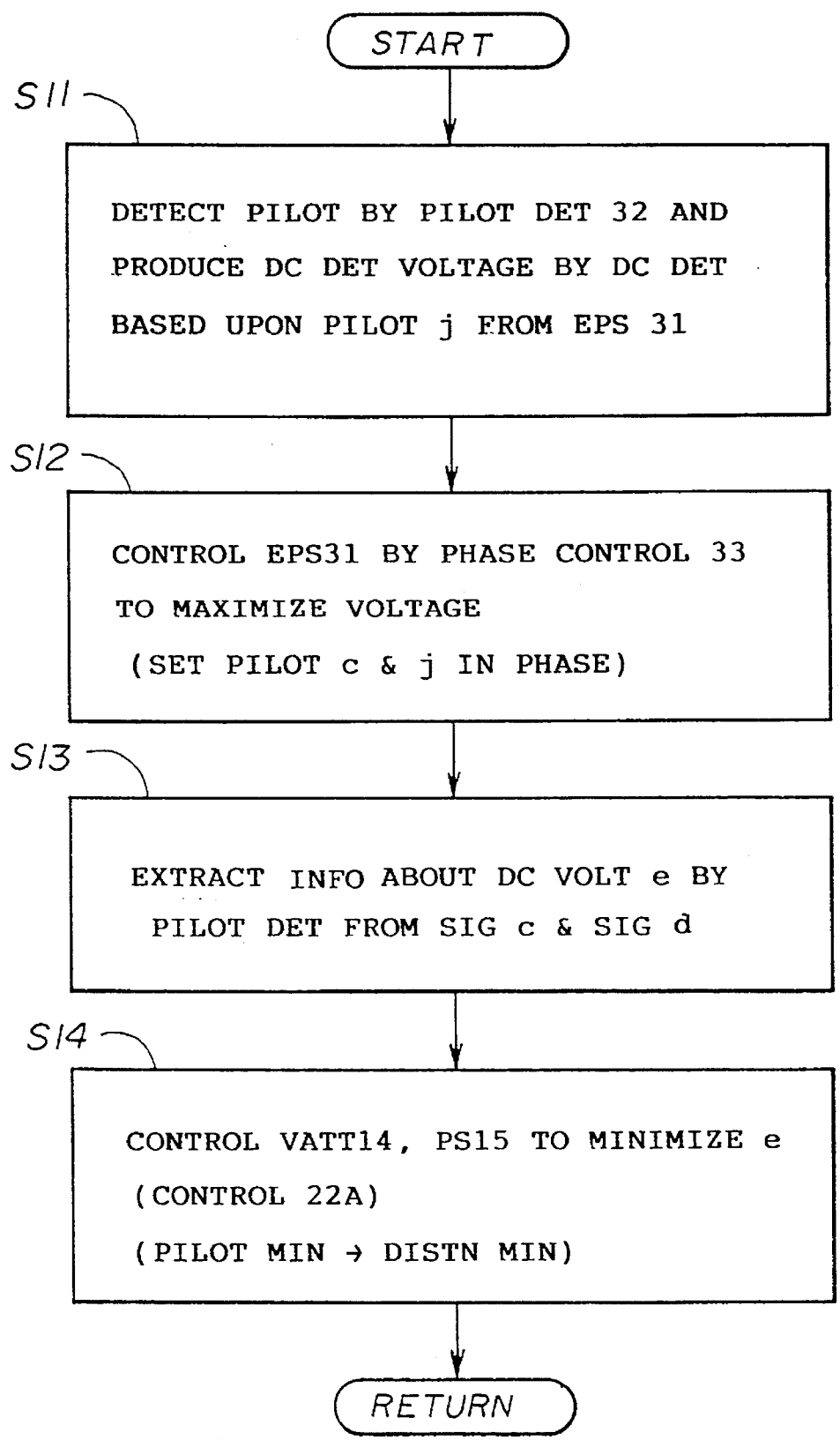
FIG. 18 is a diagram for explaining the operation of the feed forward amplifier of FIG. 17.

FIG. 18 shows a flowchart of the operation of the feed forward amplifier of FIG. 17.

Referring to FIG. 18, the pilot detector 32 detects the pilot signal component contained in the output signal c corresponding to the output RF signal of the feed forward amplifier c, and obtains the voltage signal f as a result of the d.c. detection carried out with respect to the pilot signal j, of which the phase is controlled by the variable phase shifter (EPS) 31 (Step S11).

Next, the phase control unit 33 controls the variable phase shifter 31 in response to the voltage signal f from the pilot detector 32 such that the signal f is maximized (Step S12). Thereby, the phase of the signal j of the variable phase shifter 31 is set identical with the phase of the pilot signal component contained in the output signal c.

Next, the d.c. voltage e is extracted from the signal c and the signal d that has been branched from the signal j (Step S13).

Further, the control circuit 22A controls the variable attenuator 14 and the variable phase shifter 15 such that the d.c. voltage e from the pilot detector 21 is minimized similarly as before. Thereby, the voltage for the pilot signal component (and hence the distortion) in the distortion elimination loop 2 is minimized.

In the present embodiment, too, the control of each of the steps is achieved independently, and the problem such as slow convergence of operation does not occur.

Figure 19:
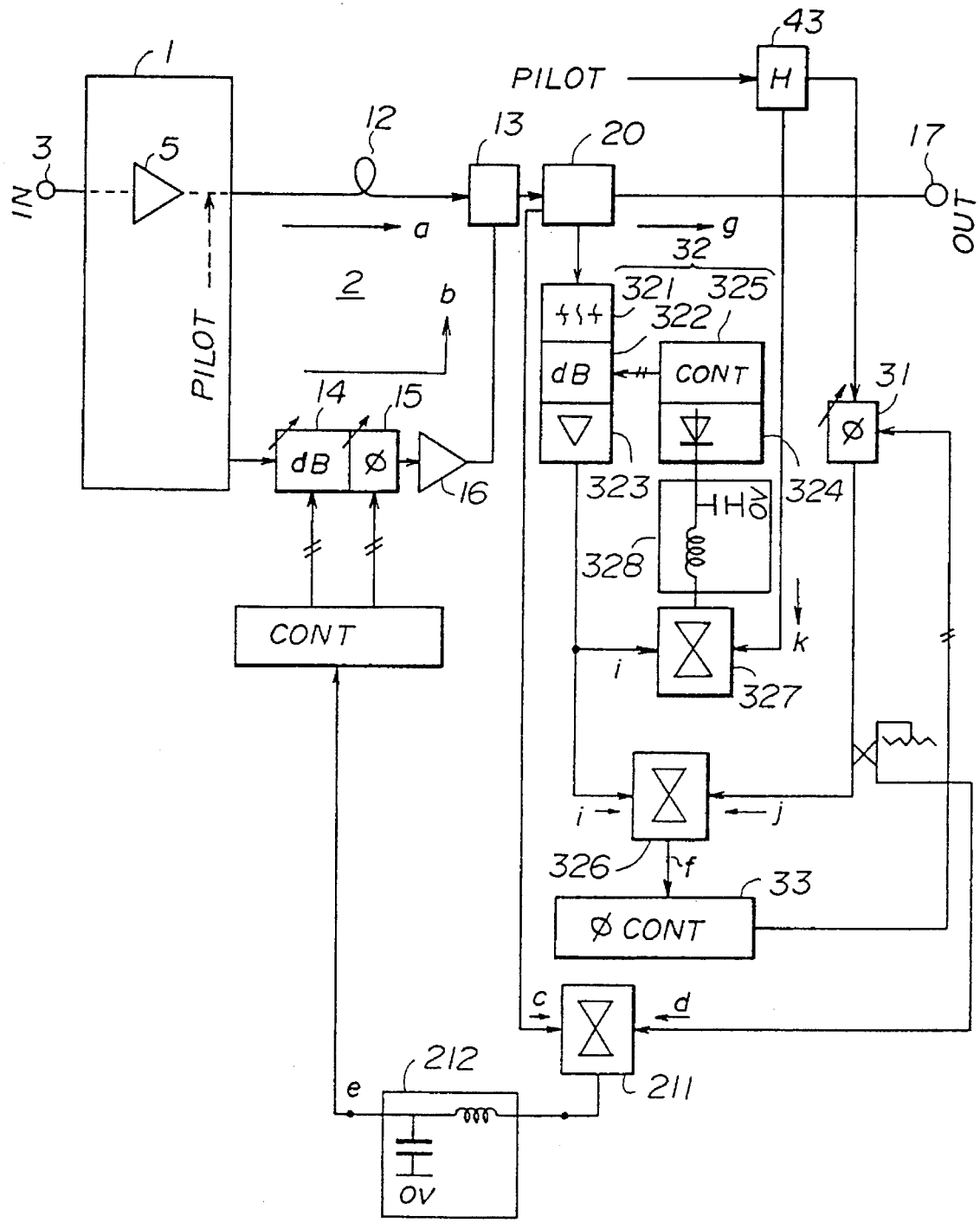
FIG. 19 is a diagram showing the construction of a feed forward amplifier according to a fifth embodiment of the present invention.

Next, a feed forward amplifier according to a fifth embodiment will be described with reference to FIG. 19. In FIG. 19, those parts described already are designated by the same reference numerals and the description thereof will be omitted.

Referring to FIG. 19, the present embodiment differs from the embodiment of FIG. 17 in the point that a mixer 327 and a low pass filter 328 are provided between the amplifier 323 and the detector 324 forming the pilot detector 32, wherein the mixer 327 is supplied with the output signal i of the amplifier 323 and a pilot signal k that has been branched by a hybrid circuit 43, while the low pass filter 328 supplies the output signal of the mixer 327 to the detector 324.

In contrast to the case of FIG. 17 wherein the d.c. detection is carried out by applying an AGC to the pilot signal, the level of which is known beforehand, the present embodiment applies the d.c. detection to the pilot signal after setting the level of the pilot signal in the output RF signal c to be coincident to the actual level of the pilot signal.

More specifically, when setting the level of the pilot signal component that has been extracted by the band pass filter 321 to be coincident to the predetermined level in the pilot detector 32, the signal i of the amplifier 323 and the foregoing pilot signal k are supplied to the mixer 327 for the d.c. detection, wherein the d.c. component of the pilot signal thus detected by the mixer 327 is supplied to the control unit 325 via the low pass filter 328 and the detector 324. Thereby, the control unit 325 achieves the automatic gain control by controlling the variable attenuator 322 such that the signal i that is supplied to the mixer 326 of the next stage and the signal j outputted from the variable phase shifter 321 have the same level. Thus, one can set both pilot signal components to have the same phase and same level, by merely controlling the variable phase shifter 31 via the phase control unit 33, such that the voltage signal f outputted from the mixer 326 becomes maximum.

In other words, by controlling the variable attenuator 14 and the variable phase shifter 15 via the control circuit 22A such that the level of the signal e, which is obtained from the low pass filter 212 by feeding the signal c and the signal d (which is equivalent to the signal j) to the mixer 211, to become minimum, one can eliminate the distortion components from the main signal components.

Figure 20:
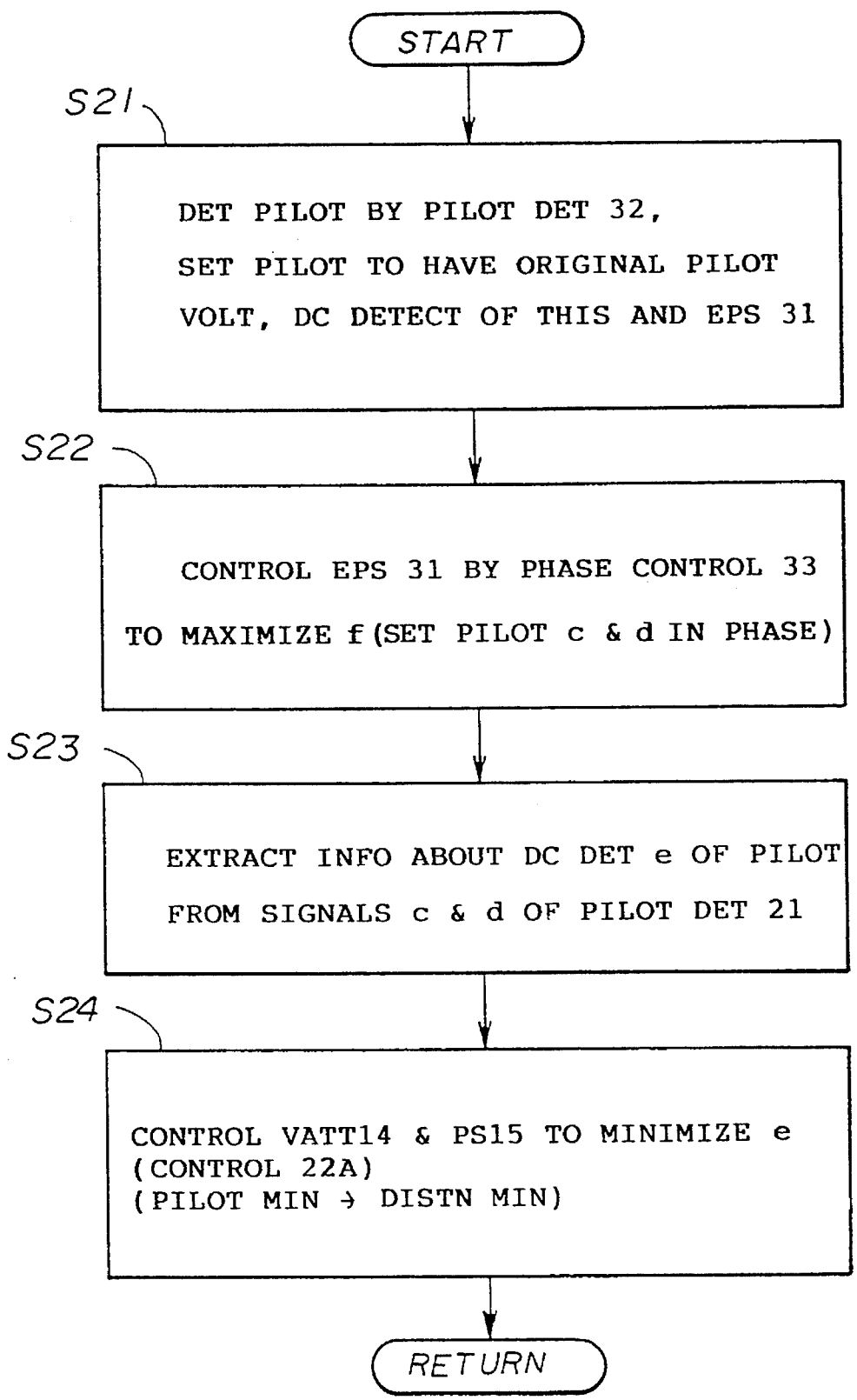
FIG. 20 is a diagram for explaining the operation of the feed forward amplifier of FIG. 19.

Next, the operation of the feed forward amplifier of FIG. 19 will be described with reference to the flowchart of FIG. 20.

First, the pilot detector 32 is activated to detect the pilot signal component contained in the output signal c of the distortion elimination loop 2 and sets the AGC circuit 32 such that the detected voltage is equal to the voltage of the original pilot signal. Further, the pilot signal component thus detected and the pilot signal d, the phase of which is subjected to the control by the variable phase shifter 31, are supplied to the mixer 326 for the d.c. detection. As a result, one obtains the d.c. voltage signal f (Step S21).

In response to the d.c. voltage signal f thus obtained, the phase control unit 33 controls the variable phase shifter 31 such that the d.c. voltage signal f has the maximum level (Step S22). As a result of this process, the pilot signal component in the output signal c of the distortion elimination loop 2 and the original pilot signal d are set to have the same phase.

Based upon the pilot signals c and d set as such, the pilot detector 21 extracts the information indicative of the d.c. voltage e (Step S23).

Thereafter, the control circuit 22A controls the variable attenuator 14 and the variable phase shifter 15 such the d.c. voltage e of the pilot detector 21 is minimized. In correspondence to this, the pilot signal component (and hence the distortion components) in the distortion elimination loop 2 is minimized.

According to the present invention, the pilot signal component in the distortion elimination loop 2 is set to have the same phase (and level) as the original pilot signal initially, and the cancellation of the pilot signal component is achieved thereafter by inverting the phase of the pilot signal components.

Figure 21:
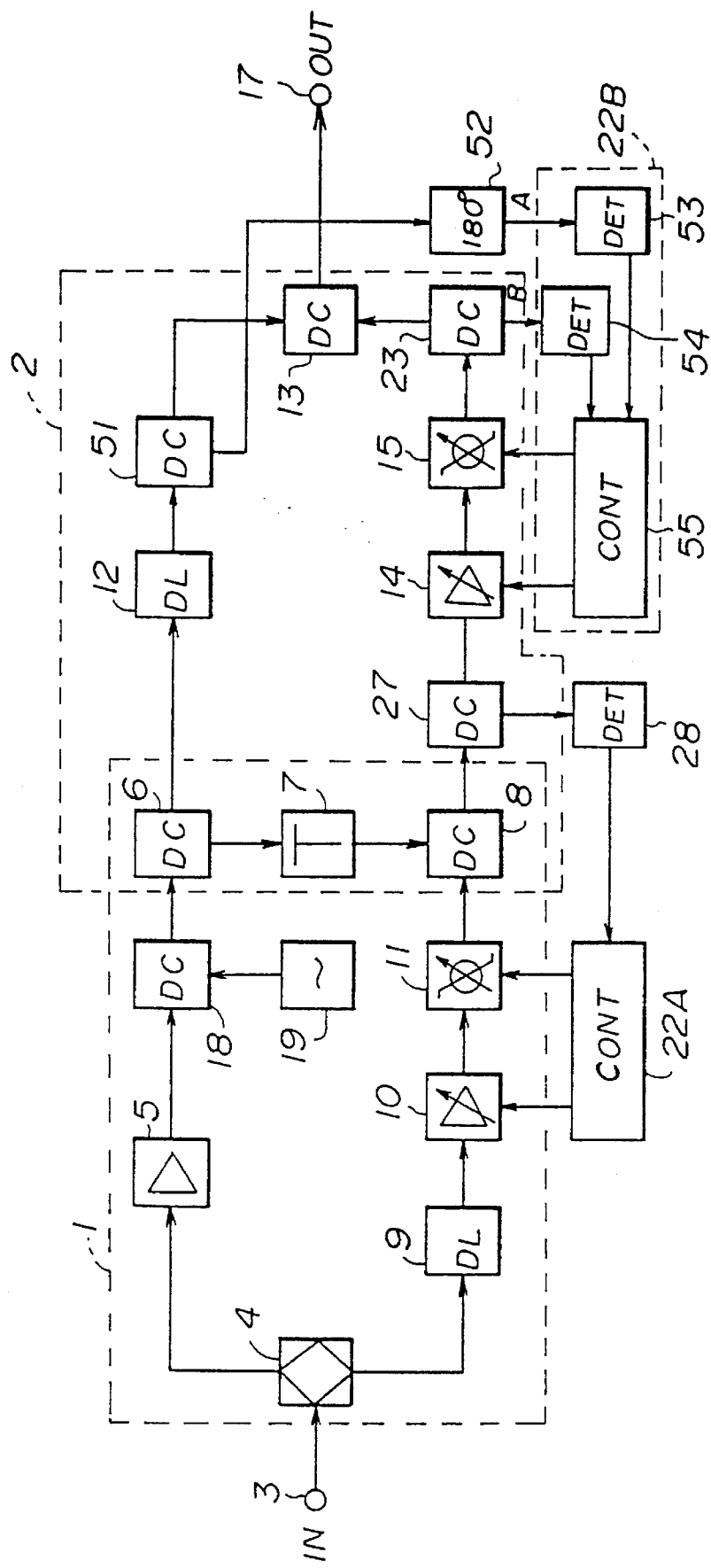
FIG. 21 is a diagram showing the construction of a feed forward amplifier according to a sixth embodiment of the present invention.

Next, a feed forward amplifier according to a sixth embodiment of the present invention will be described with reference to FIG. 21. In FIG. 21, those parts corresponding to the previous embodiments are designated by the same reference numerals and the description thereof will be omitted.

Figure 6:
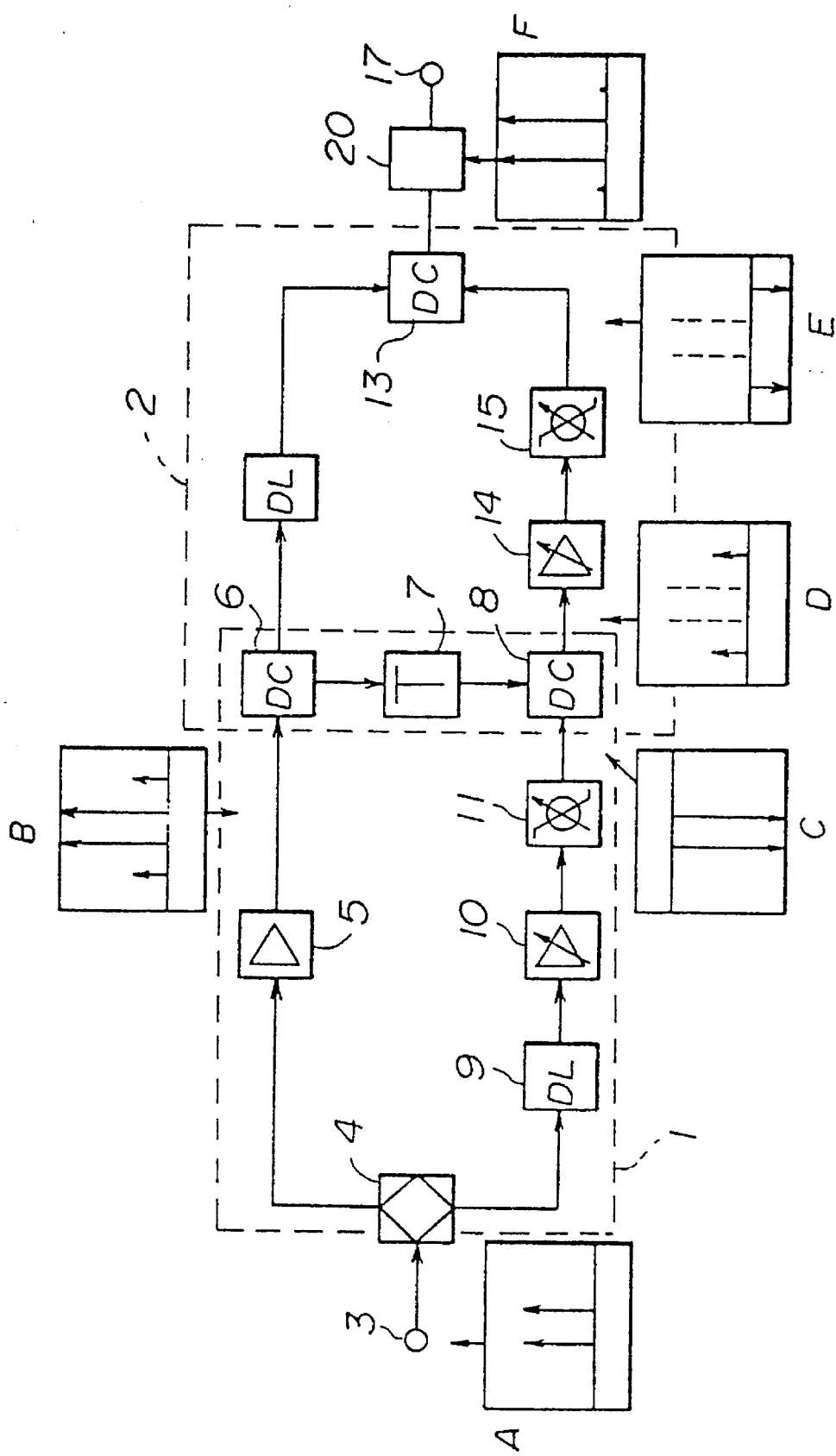
FIG. 6 is a diagram for explaining another problem occurring in the conventional feed forward amplifier.

The present embodiment is an improvement of the conventional feed forward amplifier of FIG. 6 and includes the directional coupler 27 for branching the distortion output signal outputted from the distortion extraction loop, the detector 28 for detecting the main signal component remaining in the distortion output signal that has been branched by the directional coupler 27, and the control circuit 22A that minimizes the main signal component in the distortion output signal by controlling the variable attenuator 10 and the variable phase shifter 11 in response to the output of the detector 28.

In addition, in order to eliminate the problem of reliability of detection of the pilot signal as discussed with reference to FIG. 6, the present embodiment (FIGS. 21 and 22) includes a directional coupler 51 in the distortion elimination loop 2 for branching the output RF signal that has passed through the delay line 12, and a phase inverter 52 is provided for inverting the phase of the output RF signal branched by the directional coupler 51. The phase inverter 52 produces an output signal designated as A, wherein there is provided a detector 53 for detecting the signal A.

Further, the feed forward amplifier includes the directional coupler 23 for branching the distortion output signal that has been processed by the variable attenuator 14 and the variable phase shifter 15, and there is further provided a detector 54 for detecting the pilot signal B that is contained in the distortion output signal branched by the directional coupler 23. It will be noted that the output of the detector 43 and the output of the detector 54 are supplied to the control unit 55. The control unit 55 in turn controls the variable attenuator 14 and the variable phase shifter 15 in response to the output signals of the detectors 53 and 54, such that the signal A and the signal B have the same amplitude and phase. In other words, the control unit 55 controls the signals A and B so that the relationships $|A+B|=|A|+|B|$ and $|A|=|B|$ hold.

As the signal A has a phase offset by 180° with respect to the signal that is supplied to the directional coupler 13 from the directional coupler 51, one can cancel out the non-linear distortion components contained in the output RF signal that has passed through the delay line 12 in the directional coupler 13 by the distortion output signal supplied from the directional coupler 23. It should be noted that non-linear distortion components in the output RF signal have the same amplitude and opposite phase relationship with respect to the non-linear distortion components that are contained in the distortion output signal. As a result, one obtains the main signal components alone on the output terminal 17. In the present embodiment, the optimization of the feed forward loop for cancellation of the non-linear distortion components does not rely upon the minute non-linear distortion components remaining in the output RF signal outputted from the directional coupler 13. Thereby, the optimization of the feed forward loop can be achieved with reliability. In FIG. 21, it should be noted that the detectors 53 and 54 as well as the control unit 55 form the second control unit 22B that controls the distortion elimination loop 2.

Next, the construction of the control unit 55 used in the feed forward amplifier of FIG. 21 will be described with reference to FIG. 22.

Figure 22:
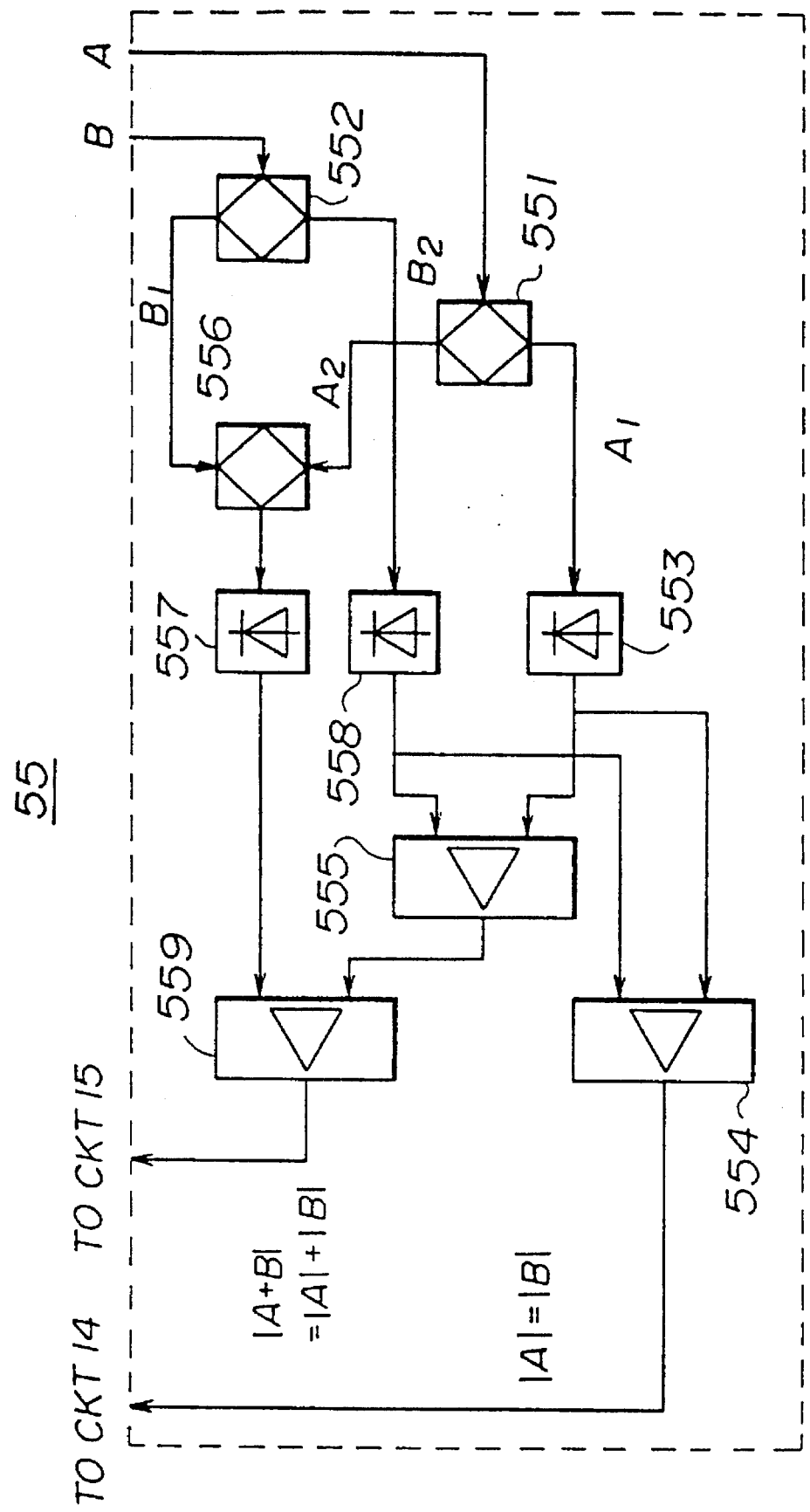
FIG. 22 is a diagram showing the construction of a part of the feed forward amplifier of FIG. 21.

Referring to FIG. 22, the control unit 55 includes a first distributor 551 supplied with the output of the detector 53 corresponding to the signal A for distributing the same into two signal paths and a second distributor 552 supplied with the output of the detector 54 corresponding to the signal B for distributing the same into two signal paths, wherein a first output signal $A_1$ of the power distributor 551 is supplied on the one hand to a first input terminal of a comparator 554 after detection in a detector 553 and simultaneously to a first input terminal of the comparator 555. On the other hand, a second output signal $A_2$ of the distributor 551 is supplied to a directional coupler 556. The directional coupler 556 is further supplied with an output signal $B_1$ of the power distributor 552, wherein the directional coupler 556 produces and supplies an output signal formed as a result of synthesis of the signal $A_2$ and the signal $B_1$ to a detector 557. Further, the other output signal, a signal $B_2$, of the power distributor 552 is supplied to a detector 558.

The output of the detector 558 is supplied to a second input terminal of the comparator 554, wherein the comparator 554 produces an output signal indicative of the difference in the amplitude of the signal that is supplied to the first input terminal and the signal that is supplied to the second input terminal. The output signal of the comparator 554 is thereby supplied to the variable attenuator 14. In response to this, the variable attenuator 14 changes the attenuation factor applied to the distortion output signal that has been produced by the directional coupler 8 in response to the output of the comparator 554, such that the output of the comparator 554 becomes zero.

The output of the detector 558 is supplied also to the second input terminal of the comparator 555, wherein comparator 555 produces an output signal indicative of a difference between the signal A and the signal B, similarly to the comparator 554, and supplies the output signal thus produced to a first input terminal of another comparator 559. The comparator 559 is further supplied with an output signal of the detector 557 at a second input terminal, and produces a signal indicative of the difference between the signal supplied to the first input terminal and the signal supplied to the second input terminal. The signal thus obtained by the comparator 559 is supplied to the variable phase shifter 15 for controlling the phase shift caused by the phase shifter 15. The output signal of the comparator 559 is represented mathematically as |A+B|- (|A|+|B|), wherein the variable phase shifter 15 changes the phase characteristics thereof such that the value represented by the foregoing equation becomes zero. When the conditions |A|=|B| and |A+B|=|A|+|B| are satisfied, the respective output of the comparators 554 and 559 become zero and the operation of the distortion elimination loop converges. As explained before, because of the fact that the control unit 55, and hence the control unit 22B, achieves the control of the distortion elimination loop by comparing the signal A and the signal B, the control operation of the feed forward amplifier of the present embodiment is more stabilized, compared with that of the conventional feed forward amplifier shown in FIG. 6. This advantage appears particularly conspicuous in the vicinity of the point of convergence.

Figure 23:
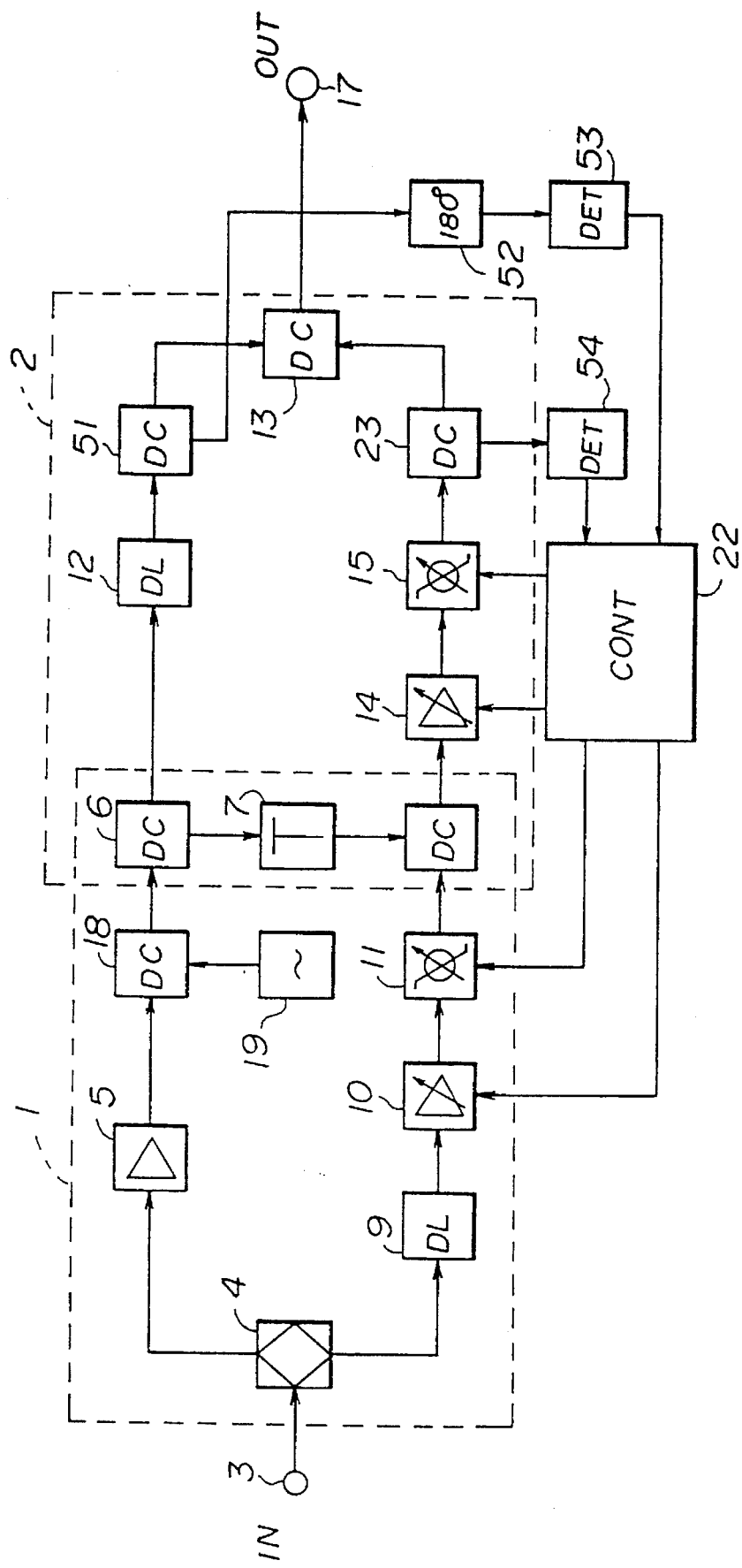
FIG. 23 is a diagram showing the construction of a feed forward amplifier according to a seventh embodiment of the present invention.

FIG. 23 shows a seventh embodiment of the present invention, wherein it will be noted that the present embodiment corresponds the a modification of the embodiment of FIG. 21. Thus, those parts in FIG. 23 that correspond to the parts in FIG. 21 are designated by the same reference numerals and the description will be omitted.

In the present embodiment, the control of the distortion extraction loop 1 and the control of the distortion elimination loop 2 are achieved by the same control circuit 22. Thus, not only the distortion elimination loop 2 but also the distortion extraction loop are controlled such that the foregoing conditions of convergence of |A|=|B| and |A+B|=|A|+|B| are maintained. Because of this, the directional coupler 27 and the detector 28 as well as the first control unit 22A are not used. The control of the distortion elimination loop 1 is achieved, for example, by controlling the variable attenuator 10 by the output of the comparator 554 shown in FIG. 22 and by controlling the phase shifter 11 in response to the output of the comparator 554 of FIG. 22. Although the present embodiment cannot provide the exact adjustment of the distortion extraction loop 1 and the distortion elimination loop 2, the construction of the feed forward amplifier is significantly simplified and the convergence of the amplifier is facilitated.

Figure 24:
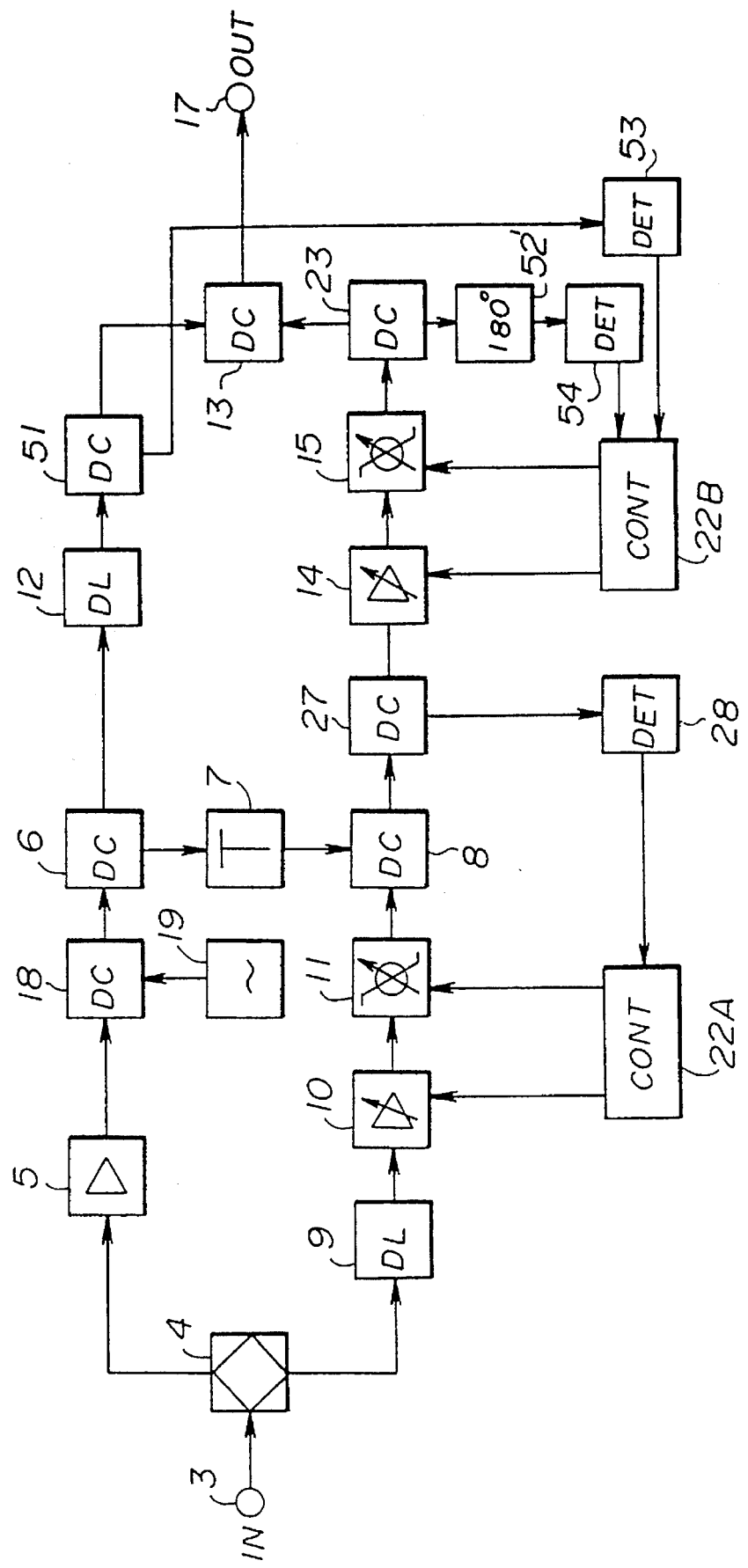
FIG. 24 is a diagram showing the construction of a feed forward amplifier according to an eighth embodiment of the present invention.

FIG. 24 shows an eighth embodiment of the present invention corresponding to a modification of the embodiment of FIG. 21. Thus, those parts of FIG. 24 that are common with the parts used in the construction of FIG. 21 are designated by the same reference numerals and the description thereof will be omitted.

In the present embodiment, the phase inverter 52 provided in the construction of FIG. 21 between the directional coupler 51 and the detector 53 is removed, and a phase inverter 52' is interposed between the directional coupler 23 and the detector 54. The construction of FIG. 24 can also provide an operation identical with that of the construction of FIG. 21.

It should be noted that the control unit 55 of FIG. 21 may be constructed by a microprocessor. Thereby, the control is achieved by software. In each of the embodiments of FIGS. 21–23, one can achieve a reliable detection even when a low cost detector is used for the detectors 53 and 53, because of the large input signal.

Figure 1:
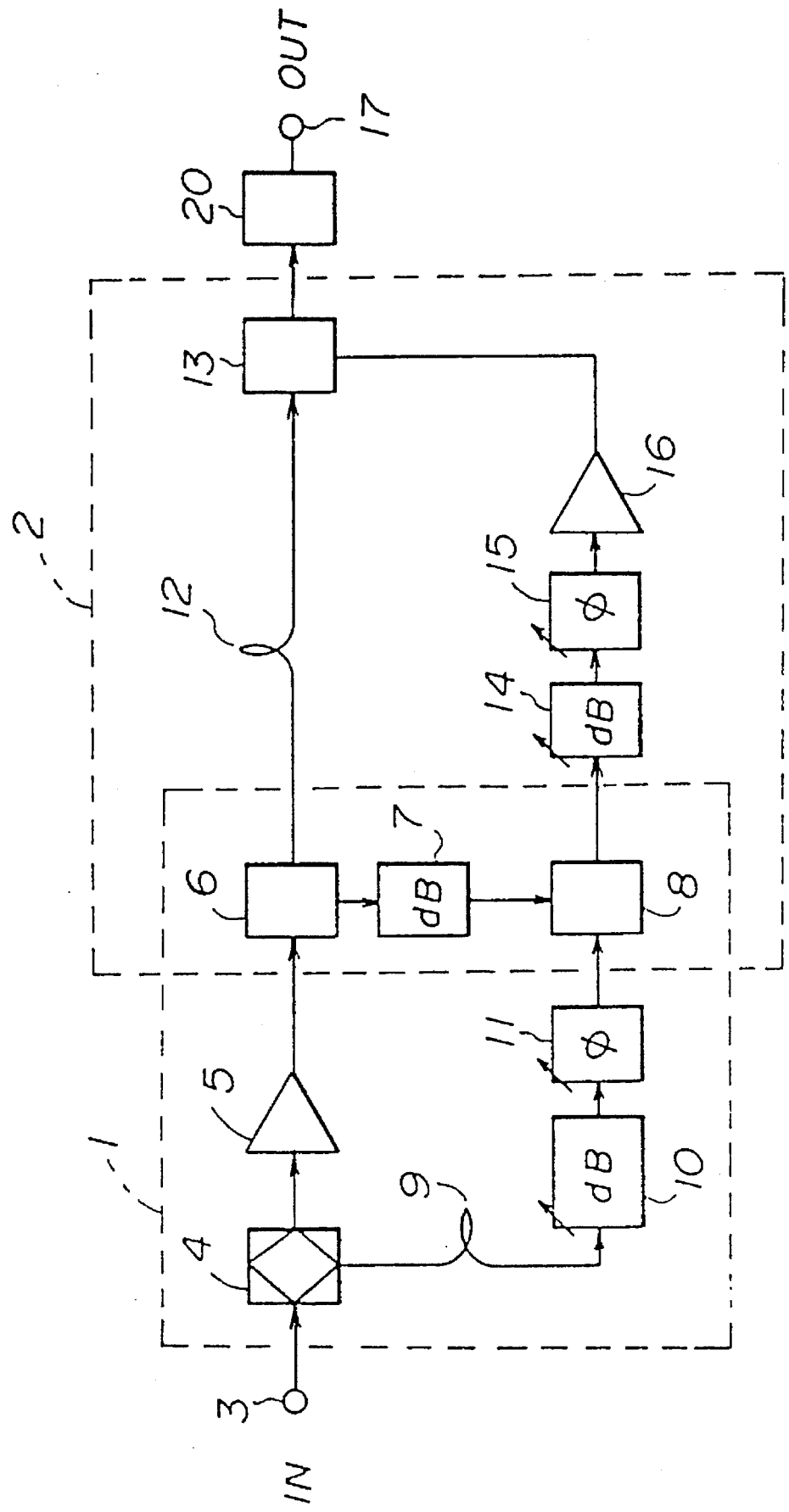
FIG. 1 is a diagram showing the construction of a conventional, fundamental feed forward amplifier.

Next, a ninth embodiment of the present invention will be described with reference to FIG. 25, wherein the present embodiment relates to an improvement of the distortion extraction loop 1 used in the conventional feed forward amplifier shown in FIG. 1. In the present embodiment, one may use the distortion elimination loop shown in FIG. 1 or any of the distortion elimination loops described heretofore.

Figure 25:
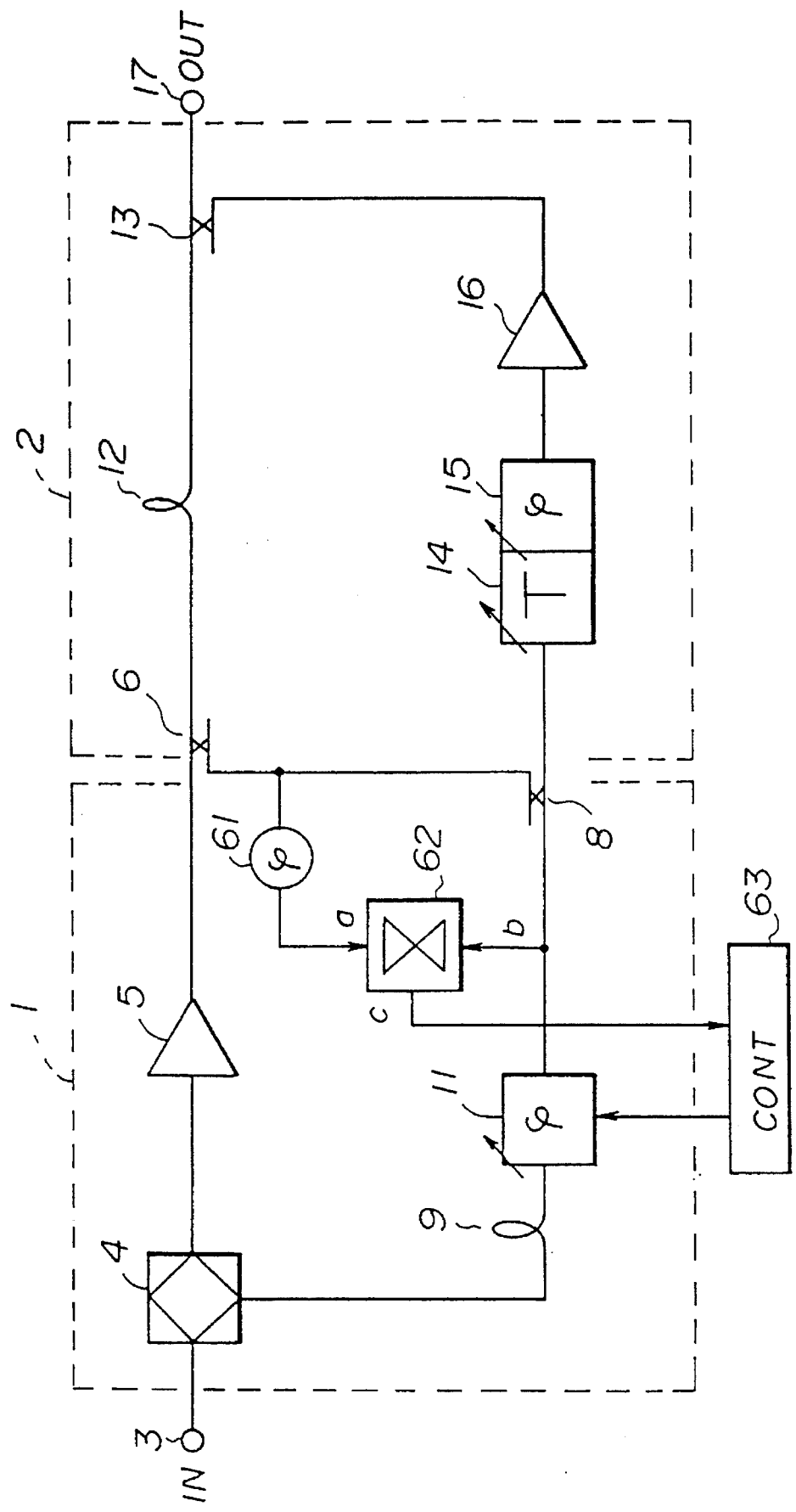
FIG. 25 is a diagram showing the construction of a feed forward amplifier according to a ninth embodiment of the present invention.

Referring to FIG. 25, the feed forward amplifier of the present embodiment is supplied with the output RF signal from the main amplifier 5 after branching by the directional coupler 6, wherein there is provided a phase shifter 61 for causing a phase shift of +90° or −90° in the output RF signal thus supplied. The phase shifter 61 supplies an output signal a to a mixer 72. On the other hand, the phase shifter 11 changes the phase of the input RF signal supplied via the delay line 9 by about −90° or +90°, such that there exists a phase difference of 180° between the output RF signal supplied to the directional coupler 8 and the input RF signal.

Further, the foregoing input RF signal b that has passed through the variable phase shifter 11 is supplied to the foregoing mixer 62, wherein the mixer 62 carries out a synchronous detection of the signal a while using the signal b as the carrier. Thereby, the mixer 62 produces a d.c. output signal c. It should be noted that the output signal c corresponds to the main signal components contained in the signal a and that the magnitude of the signal c becomes zero when there exists a phase difference of exactly 90° between the signal a and the signal b. See FIG. 15 explained before. Thus, by controlling the variable phase shifter 11 such that the output level of the signal c is zero, one can set the phase difference between the signal a and the signal b to be exactly 90 degrees and simultaneously the phase difference between the output RF signal and the input RF signal, at the directional coupler 8 to be exactly 180°. As a result, the distortion extraction loop 1 can extract the non-linear distortion components with reliability.

In order to optimize the distortion extraction loop 1 described above, the feed forward amplifier of FIG. 25 is provided with a control unit 63 that is supplied with the d.c. output signal c of the mixer 62 for controlling the variable phase shifter 77. Of course, the control unit 63 controls the phase shifter 11 such that the magnitude of the d.c. output signal c becomes zero.

According to the present embodiment, one can construct a high precision distortion elimination loop with a simple construction. By combining the distortion extraction loop of the present embodiment with the distortion extraction loop described in any of the foregoing embodiments, one can construct a feed forward amplifier wherein the non-linear distortion is effectively suppressed.

Figure 26:
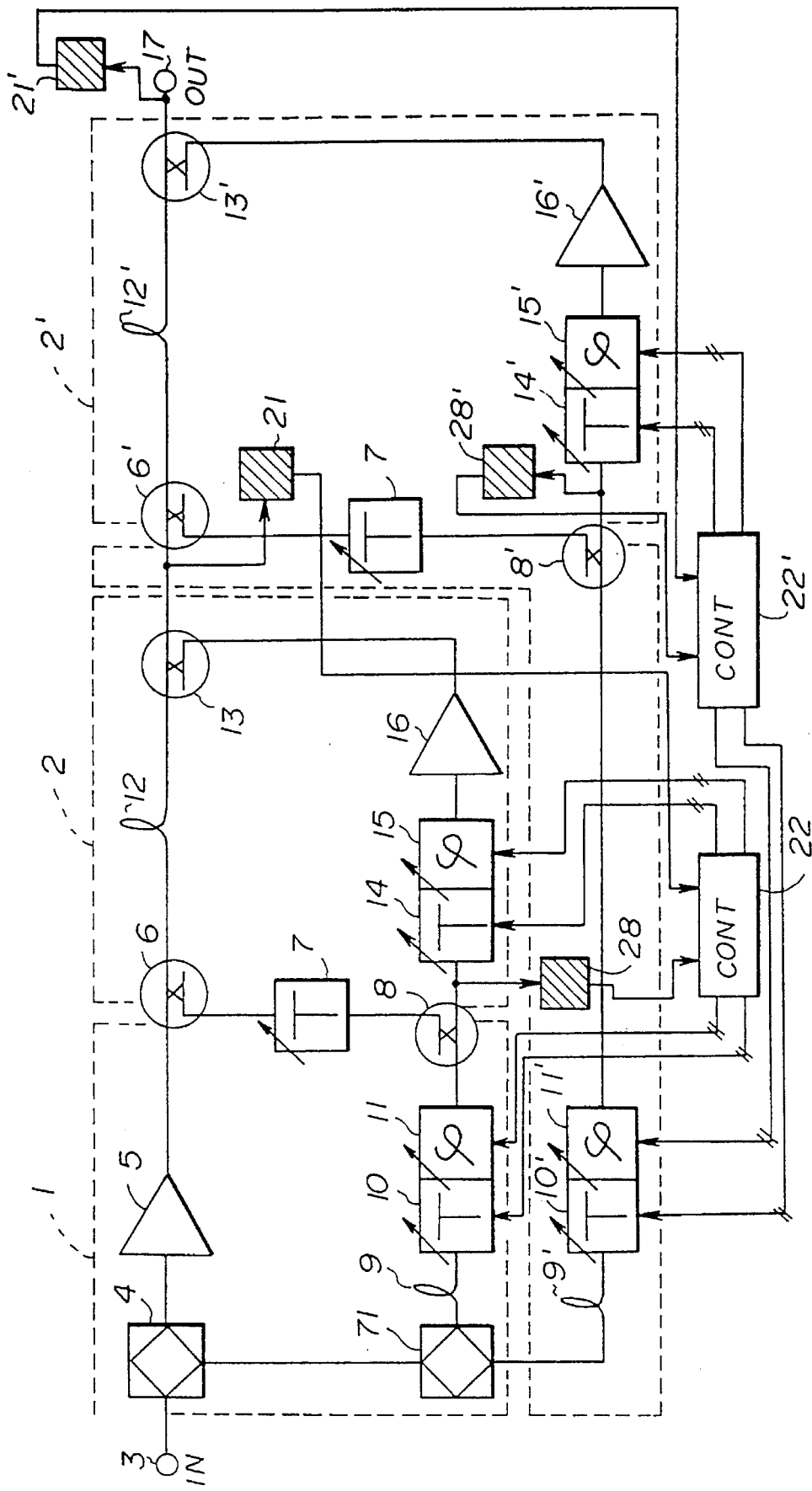
FIG. 26 is a diagram showing the construction of the feed forward amplifier according to a tenth embodiment of the present invention.

FIG. 26 shows the construction of a feed forward amplifier according to a tenth embodiment of the present invention. The present embodiment is an improvement of the conventional feed forward amplifier which is shown in FIG. 1, wherein it will be noted that the distortion elimination loop is cascaded in a plurality of stages.

Referring to FIG. 26, the present embodiment employs another hybrid circuit 71 between the hybrid circuit 4 and the delay line 9 for distributing the input RF signal supplied from the hybrid circuit 4 to the delay line 9 and to another delay line 9'. Similarly to the previous embodiments, the input RF signal that has been supplied to the delay line 9 is subjected to the extraction of distortion components in the distortion elimination loop 1, and the non-liner distortion components thus extracted are used in the directional coupler 13 for canceling out the non-linear distortion components contained in the main signal.

In the present embodiment, the RF signal thus removed with the non-linear distortion components is not supplied to the output terminal 17 directly but to another distortion elimination loop 2' of the next stage. On the other hand, the input RF signal distributed to the delay line 9' in the hybrid circuit 71 is supplied so to pass through a variable attenuator 10' and a variable phase shifter 11', wherein the input RF signal thus processed is synthesized with the output RF signal branched by a directional coupler 6'. Thereby, the non-linear distortion components are extracted. In FIG. 26, it should be noted that the components forming the distortion elimination loop 2' are designated with the corresponding reference numerals of the loop 2 except for a prime symbol.

The non-linear distortion components thus extracted by the directional coupler 8' pass through the variable attenuator 14', the variable phase shifter 15' and the secondary amplifier 16' and are synthesized with the output RF signal supplied from distortion elimination loop 2 of the previous stage. Thereby, the non-linear distortion components remaining in the foregoing output RF signal are canceled out. Further, in order to control the operation of the foregoing distortion extraction loop 1 as well as the operation of the distortion elimination loops 2 and 2', detectors 21, 21', 28 and 28' are provided. The detector 28 is used, as already explained with the previous embodiment, for detecting the main signal components remaining in the distortion output signal extracted by the directional coupler 8, while the detector 28' is used to detect the main signal components remaining in the distortion output signal that has been extracted by the directional coupler 8'. Further, the detector 21 is used for detecting the non-linear distortion components remaining in the output RF signal extracted by the directional coupler 13, while the detector 21' is used for detecting the non-linear distortion components remaining in the output RF signal extracted by the directional coupler 13' and outputted to the output terminal 17.

According to the present embodiment, the non-linear distortion components remaining in the output RF signal are removed in the distortion elimination loop 2, and the non-linear distortion components still remaining after the foregoing process are removed by the distortion elimination loop 2'. Thereby, a more complete elimination of the non-linear distortion components can be achieved as compared with the conventional feed forward amplifier.

Next, an eleventh embodiment of the present invention will be described with reference to FIG. 27.

The present embodiment addresses the problem that may occur in the embodiment of FIG. 26 that the residual non-linear distortion components have so small a magnitude that the control of the loop 2', based upon the output of the detector 21', may become unstable. In order to overcome the problem, the present embodiment employs an injection of a pilot signal into the output RF signal of the amplifier 5. The pilot signal that is injected into the output RF signal of the main amplifier 5 and the pilot signal that is injected into the output RF signal extracted by the directional coupler 13 are preferably the same signal and, thus, the same pilot generator 19 is used for producing the pilot signals. In the construction of FIG. 27, the pilot signal is injected into the output RF signal that has experienced the removal of the distortion in the distortion elimination loop 2 and, and because of this, the problem that the pilot signal detected by the detector 21' is too small for the reliable operation of the control system is overcome. Of course, the RF signal outputted from the output terminal 17 is substantially free from the non-linear components.

Figure 27:
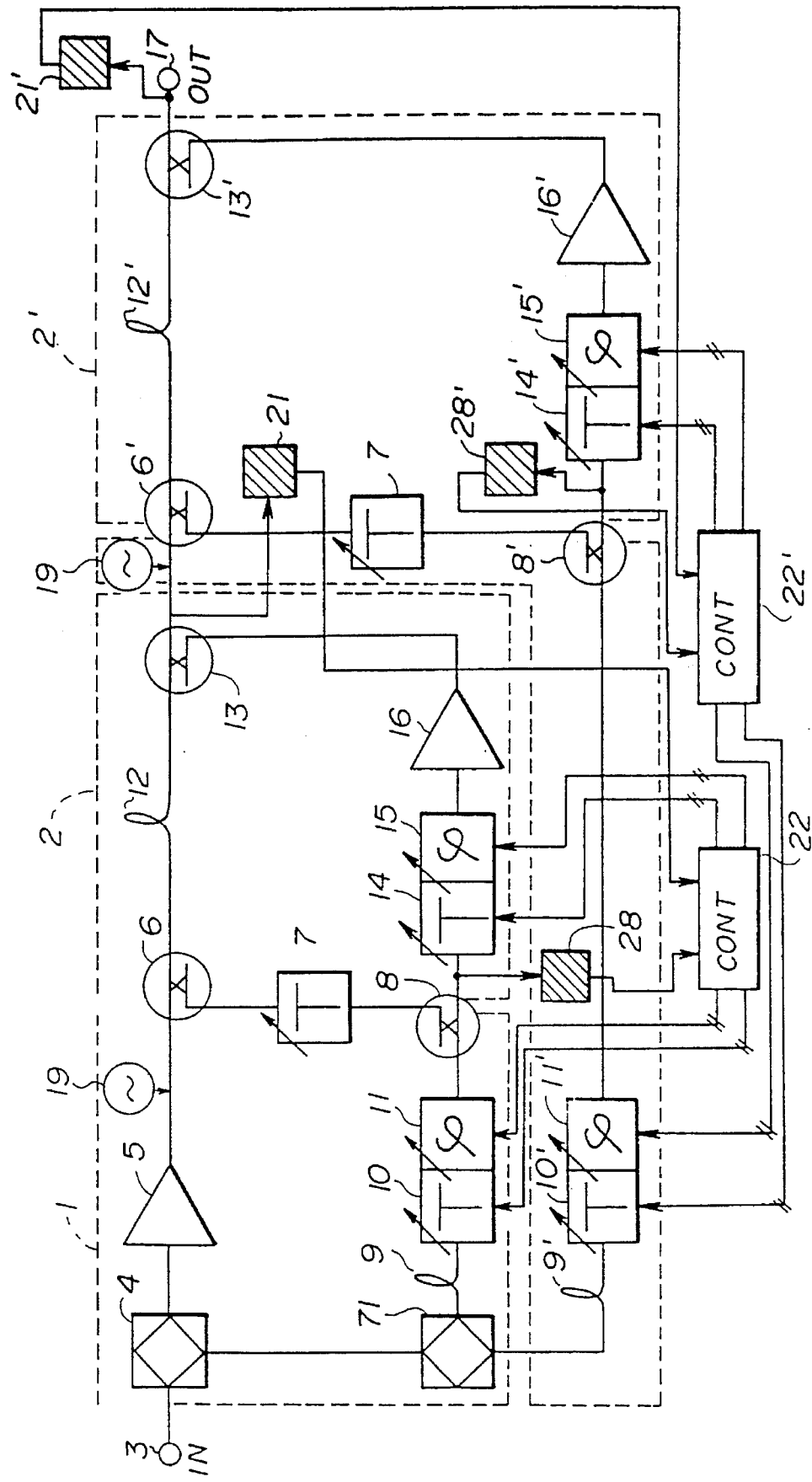
FIG. 27 is a diagram showing a feed forward amplifier according to an eleventh embodiment of the present invention.

In the embodiments of FIGS. 26 and 27, one may employ the distortion elimination loop of FIGS. 21–24.

Further, the present invention is not limited to the embodiments described heretofore, but various variations and modifications may be made without departing from the scope of the invention.

In the feed forward amplifier the present invention, it is possible to carry out the operation of the distortion extraction loop even when the level of the input RF signal has changed. Thus, the feed forward amplifier of the present invention is particularly suitable for broad band RF terminals for use in base stations of mobile telephone networks that include therein mobile terminals. Further, because of the fact that the feed forward amplifier of the present invention can achieve the operation of the distortion extraction loop and the operation of the distortion elimination loop independently, a quick convergence of the operation is expected. Further, the present invention provides high precision removal of distortions by applying synchronous detection, in the distortion elimination loop and/or distortion extraction loop, to the pilot signal that has been injected for the extraction and removal of the distortion. In the present invention, by carrying out the detection of the non-linear distortion components before the removal of the distortion with respect to both amplitude and phase, a reliable and high precision control for removing the distortion is achieved. Further, according to the present invention, by carrying out the elimination of the distortion over a number of successive steps, one can almost completely remove the non-linear distortion components remaining in the output RF signal.

We claim:

1. A feed forward amplifier comprising:

RF amplification means, supplied with an input RF signal at an input terminal, for amplifying the input RF signal and thereby producing an output RF signal;

a distortion extraction loop, supplied with said input RF signal from said input terminal and further with said output RF signal from said RF amplification means, for extracting, from said output RF signal, non-linear distortion components formed in said output RF signal as a result of amplification in said RF amplification means;

variable phase shifter meanst in said distortion extraction loop, for varying a phase of said input RF signal that has been supplied to said distortion extraction loop;

variable attenuation means, in said distortion extraction loop, for attenuating an amplitude of said input RF signal that has been supplied to said distortion extraction loop;

distortion extraction means, in said distortion extraction loop and supplied with said input RF signal after processing in said variable phase shifter means and said variable attenuation means and with said output RF signal from said RF amplification means, for producing a distortion output signal that includes non-linear distortion components;

distortion elimination means, supplied with said distortion output signal from said distortion extraction means and said output RF signal from said RF amplification means, for canceling out said non-linear distortion components contained in said output RF signal by said non-linear distortion components contained in said distortion output signal;

first control means, supplied with said input RF signal that has been supplied to said input terminal and further with said distortion output signal, for extracting a main signal component contained in said distortion output signal said first control means controlling said variable phase shifter means and said variable attenuation means independently of each other so as to decrease a ratio of a level of said main signal component to a level of said input RF signal;

said first control means further comprising branching means for branching said input RF signal supplied to said input terminal, first level detection means for detecting a level of said input RR signal that has been branched by said branching means, second level detection means for detecting a level of said main signal component contained in said distortion output signal of said distortion elimination means, and a control circuit supplied with output signals from said first and second level detection means for controlling said variable attenuation means and said variable phase shifter means in said distortion extraction means; and automatic gain control means, supplied with said output signal from said first level detection means, for controlling a level of said input RF signal supplied to said distortion extraction loop from said input terminal.

2. A feed forward amplifier comprising:

RF amplification means, supplied with an input RF signal at an input terminal, for amplifying the same and thereby producing an output RF signal;

a distortion extraction loop, supplied with said input RF signal from said input terminal and further with said output RF signal from said RF amplification means, for extracting, from said output RF signal, non-linear distortion components formed in said output RF signal as a result of amplification in said RF amplification means;

distortion elimination means, supplied with a distortion output signal from said distortion extraction loop and further with said output RF signal from said amplification means, for canceling out said non-linear distortion components contained in said output RF signal by said non-linear distortion components contained in said distortion output signal and producing a distortion-eliminated output signal;

pilot signal generation means for producing a pilot signal;

pilot signal injection means for injecting said pilot signal into said output RF signal produced by said RF amplification means;

pilot signal detection means, supplied with said pilot signal from said pilot signal generation means, for detecting a pilot signal component contained in the distortion-eliminated output signal produced by said distortion elimination means and for conducting d.c. detection by mixing said pilot signal into said distortion-eliminated output signal and producing a d.c. detection signal as an output; and control means supplied with the d.c. detection signal produced by said pilot signal detection means, said d.c. detection signal being produced by said pilot signal detection means as a result of said d.c. detection, said control means controlling said distortion elimination means so as to minimize the level of said d.c. detection signal;

said pilot signal detection means further comprising phase control means for coinciding the respective phases of said pilot signal component contained in said distortion-eliminated output signal and said pilot signal injected for said d.c. detection.

3. A feed forward amplifier as claimed in claim 2, wherein said phase control means further comprises second pilot signal detection means for mixing said pilot signal contained in said distortion-eliminated output signal and said pilot signal injected for said d.c. detection, said second pilot signal detection means thereby producing a d.c. output signal, and a control circuit, supplied with said d.c. output signal from said second pilot signal detection means, for coinciding the respective phases of said pilot signal contained in said distortion-eliminated output signal and said pilot signal injected for said d.c. detection, such that said d.c. output signal of said second pilot signal detection means is maximized.

4. A feed forward amplifier as claimed in claim 3, wherein said phase control means further comprises automatic gain control means for maintaining a level of said pilot signal, contained in said distortion-eliminated output signal, at a constant level.

5. A feed forward amplifier as claimed in claim 3, wherein said phase control means further comprises automatic gain control means for setting a level of said pilot signal, contained in said distortion output signal to be coincident with a level of the pilot signal mixed for said d.c. detection.

6. A feed forward amplifier comprising:

RF amplification means, supplied with an input RF signal, for amplifying the same and thereby producing an output RF signal;

a distortion extraction loop, supplied with said input RF signal and further with said output RF signal from said RF amplification means, for extracting, from said output RF signal, non-linear distortion components formed in said output RF signal as a result of amplification in said RF amplification means, said distortion extraction loop thereby producing a distortion output signal containing therein non-linear distortion components;

a distortion elimination loop, supplied with said distortion output signal from said distortion extraction loop and further with said output RF signal from said amplification means, for canceling out said non-linear distortion components contained in said output RF signal by non-linear distortion components contained in said distortion output signal, said distortion elimination loop further comprising:

variable attenuation means, supplied with said distortion output signal produced by said distortion extraction loop, for modifying an amplitude of said distortion output signal, variable phase shifter means, supplied with said distortion output signal produced by said distortion extraction loop, for varying a phase of said distortion output signal, and distortion elimination means, supplied with said distortion output signal after processing thereof in said variable attenuation means and said variable phase shifter means and with said output RF signal from said amplification means, for synthesizing said distortion output signal and said output RF signal and thereby canceling out the non-linear distortion components contained in said output RF signal by the non-linear distortion components contained in said distortion output signal; and control means, supplied with said distortion output signal and said output RF signal, for controlling said variable attenuation means and said variable phase shifter means such that said non-linear distortion components in said output RF signal have an amplitude and a phase that are identical, respectively, to an amplitude and a phase of said non-linear distortion components contained in said distortion output signal.

7. A feed forward amplifier as claimed in claim 6, wherein said control means further comprises:

phase inversion means for inverting a phase of said output RF signal supplied to said distortion elimination loop from said distortion extraction loop;

a synthesizer for synthesizing an output signal of said phase inversion means and said distortion output signal supplied to said distortion elimination loop for producing a synthetic output signal;

a first detector for detecting an output of said synthesizer to produce a first detection signal, a second detector for detecting said distortion output signal for producing a second detection signal, and a third detector for detecting said output signal of said phase inversion means for producing a third detection signal; and a control circuit supplied with said first through third detection signals for controlling said variable attenuation means and said variable phase shifter means such that said second and third detection signals have a common magnitude and such that a sum of said second and third detection signals has a magnitude which is identical to a magnitude of said first detection signal.

8. A feed forward amplifier as claimed in claim 6, wherein said control means further comprises:

phase inversion means for inverting a phase of said distortion output signal after processing in said variable attenuation means and said variable phase shifter means;

a synthesizer for synthesizing an output signal of said phase inversion means and said output RF signal for producing a synthetic output signal;

a first detector for detecting said synthetic signal of said synthesizer to produce a first detection signal, a second detector for detecting said output RF signal to produce a second detection signal, and a third detector for detecting said output signal of said phase inversion means to produce a third detection signal; and a control circuit, supplied with said first through third detection signals, for controlling said variable attenuation means and said variable phase shifter means such that said second and third detection signals have a common magnitude and such that a sum of said second and third detection signals has a magnitude which is identical to a magnitude of said first detection signal.

9. A feed forward amplifier comprising:

RF amplification means supplied with an input RF signal for amplifying the same and thereby to produce an output RF signal;

a distortion extraction loop, supplied with said input RF signal and further with said output RF signal of said RF amplification means, for extracting non-linear distortion components formed in said output RF signal as a result of amplification by said RF amplification means, said distortion extraction loop thereby producing a distortion output signal containing said non-linear distortion components; and a distortion elimination loop, supplied with said distortion output signal from said distortion extraction loop and further with said output RF signal from said RF amplification means, for canceling out said non-linear distortion components contained in said output RF signal by said non-linear distortion components contained in said distortion output signal, 1 said distortion extraction loop further comprising:

variable phase shifter means, supplied with said input RF signal, for changing a phase thereof;

phase shifter means, supplied with said output RF signal from said RF amplification means, for causing a 90° degree phase shift therein, synchronous detection means, supplied with said input RF signal after processing in said variable phase shifter means and further with said output RF signal as processed by said phase shifter means, for synchronously detecting same and thereby detecting main signal components contained in said output RF signal;

control means, supplied with said main signal components detected by said synchronous detection means, for controlling said variable phase shifter means such that said main signal components are minimized; and distortion extraction means, supplied with said input RF signal after processing by said variable phase shifter means and further with said output RF signal as produced by said RF amplification means, for canceling said main signal contained in said input RF signal and main signal components contained in said output RF signal, said distortion extraction means producing an output signal essentially consisting of said non-linear distortion components.

10. A feed forward amplifier as claimed in claim 9, wherein said synchronous detection means comprises a mixer for mixing said input RF signal, as supplied thereto, and said output RF signal and thereby for detecting said main signal components, said control means controlling said variable phase shifter means such that main signal components contained in an output signal of said mixer become zero, said control means thereby controlling said main signal in said input RF signals and said main signal components in said output RF signal to have respective, opposite phases in said distortion extraction means.

11. A feed forward amplifier comprising:

RF amplification means, supplied with an input RF signal from an input terminal, for amplifying the same and thereby producing an output RF signal;

a plurality of distortion extraction loops, each supplied with said input RF signal from said input terminal and further with said output RF signal of said RF amplification means, for extracting, from said output RF signal, non-linear distortion components formed in said output RF signal as a result of amplification means, each of said distortion extraction loops producing a corresponding distortion output signal containing therein said non-linear distortion components;

a plurality of distortion elimination loops, provided in correspondence to said plurality of distortion extraction loops, said distortion elimination loops being cascaded with each other and supplied with said output RF signal from said RF amplification means, each of said distortion elimination loops being further supplied with a corresponding distortion output signal from a corresponding distortion extraction loop for removing said non-linear distortion components from said output RF signal supplied thereto; and a plurality of distortion elimination loop control means, respectively provided in said plurality of distortion elimination loops and each thereof supplied with said output RF signal from which said non-linear distortion components are eliminated, for controlling said respective distortion elimination loop such that a level of said non-linear distortion components remaining in said output RF signal is minimized.

12. A feed forward amplifier as claimed in claim 11, wherein an output RF signal is supplied to said distortion elimination loop in correspondence to each of said plurality of distortion elimination loops.

* * * * *

UNITED STATES PATENT AND TRADEMARK OFFICE
CERTIFICATE OF CORRECTION

PATENT NO. : 5,477,187
DATED : Dec. 19, 1995
INVENTOR(S) : KOBAYASHI et al.

It is certified that error appears in the above-indentified patent and that said Letters Patent is hereby corrected as shown below:

Col. 1,  line 25, change "tend" to --tends--.

Col. 4,  line 64, change "under existence when of" to --when--.

Col. 8,  line 26, delete "that has been".

Col. 10, line 55, after "distortion" delete ".".

Col. 12, line 2, change ".feed" to --feed--;
         line 9, change "detected relatively" to --detected, relatively,--.

Col. 22, line 46 (claim 1, line 12), change "meanst" to --means,--.

Col. 23, line 5 (claim 1, line 37), change "signal said" to --signal, said--;
         line 13 (claim 1, line 45), change "RR signal" to --RF signal--.

Col. 24, line 25 (claim 5, line 4), change "signal to" to --signal, to--.

Col. 26, line 38 (claim 10, line 9), change "RF signals" to --RF signal--.

Signed and Sealed this

Eighteenth Day of June, 1996

BRUCE LEHMAN

*Attest:*

*Attesting Officer*    *Commissioner of Patents and Trademarks*